US008153344B2

(12) United States Patent
Faler et al.

(10) Patent No.: US 8,153,344 B2
(45) Date of Patent: Apr. 10, 2012

(54) METHODS FOR PRODUCING PHOTOSENSITIVE MICROPARTICLES, AQUEOUS COMPOSITIONS THEREOF AND ARTICLES PREPARED THEREWITH

(75) Inventors: Dennis L. Faler, Pittsburgh, PA (US); Forrest R. Blackburn, Monroeville, PA (US); Kevin J. Stewart, Murrysville, PA (US); Anu Chopra, Pittsburgh, PA (US); James P. Colton, Trafford, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 802 days.

(21) Appl. No.: 10/892,919

(22) Filed: Jul. 16, 2004

(65) Prior Publication Data

US 2006/0014099 A1   Jan. 19, 2006

(51) Int. Cl.
   *G03C 1/72* (2006.01)
(52) U.S. Cl. .................... 430/138; 430/270.1
(58) Field of Classification Search .................. 430/138, 430/270.1
   See application file for complete search history.

(56) References Cited

U.S. PATENT DOCUMENTS

| | | | |
|---|---|---|---|
| 108,935 A | 11/1870 | Rich | |
| 108,936 A | 11/1870 | Rich | |
| 4,046,729 A | 9/1977 | Scriven et al. | 260/29.2 TN |
| 4,358,388 A | 11/1982 | Daniel et al. | 252/62.54 |
| 4,533,254 A | 8/1985 | Cook et al. | 366/176 |
| 4,546,045 A | 10/1985 | Elias | 428/424.6 |
| 4,556,605 A | 12/1985 | Mogami et al. | 428/331 |
| 4,681,811 A | 7/1987 | Simpson et al. | 428/413 |
| 4,685,783 A | 8/1987 | Heller et al. | 351/163 |
| 4,732,790 A | 3/1988 | Blackburn et al. | 427/407.1 |
| 4,798,746 A | 1/1989 | Claar et al. | 427/407.1 |
| 4,929,693 A | 5/1990 | Akashi et al. | 526/259 |
| 4,931,220 A | 6/1990 | Haynes et al. | 252/586 |
| 4,963,461 A | 10/1990 | Takahashi et al. | 430/138 |
| 5,061,602 A | 10/1991 | Koch et al. | 430/281 |
| 5,071,904 A | 12/1991 | Martin et al. | 524/458 |
| 5,134,053 A | 7/1992 | Mueller-Hess et al. | 430/176 |
| 5,143,997 A | 9/1992 | Endo et al. | 528/60 |
| 5,208,132 A * | 5/1993 | Kamada et al. | 430/138 |
| 5,221,288 A * | 6/1993 | Kamada et al. | 8/554 |
| 5,246,748 A | 9/1993 | Gillberg-Laforce et al. | 428/1 |
| 5,252,450 A | 10/1993 | Schwerzel et al. | 430/567 |
| 5,356,713 A | 10/1994 | Charmot et al. | 428/407 |
| 5,458,814 A | 10/1995 | Kumar et al. | 252/586 |
| 5,468,802 A | 11/1995 | Wilt et al. | 524/539 |
| 5,527,879 A | 6/1996 | Nakae et al. | 528/371 |
| 5,603,757 A * | 2/1997 | Mizuguchi et al. | 106/404 |
| 5,631,382 A | 5/1997 | Tanizawa et al. | 548/407 |
| 5,639,802 A | 6/1997 | Neckers et al. | 522/25 |
| 5,645,767 A | 7/1997 | Van Gemert | 252/586 |
| 5,658,501 A | 8/1997 | Kumar et al. | 252/586 |
| 5,698,141 A | 12/1997 | Kumar | 252/586 |
| 5,723,072 A | 3/1998 | Kumar | 252/586 |
| 5,919,846 A | 7/1999 | Batlaw et al. | 524/83 |
| 5,952,131 A | 9/1999 | Kumacheva et al. | 430/21 |
| 6,022,497 A | 2/2000 | Kumar | 252/586 |
| 6,025,026 A | 2/2000 | Smith et al. | 427/316 |
| 6,060,001 A | 5/2000 | Welch et al. | 252/586 |
| 6,080,338 A | 6/2000 | Kumar | 252/586 |
| 6,113,814 A | 9/2000 | Van Gemert et al. | 252/586 |
| 6,136,968 A | 10/2000 | Chamontin et al. | 540/581 |
| 6,150,430 A | 11/2000 | Walters et al. | 522/79 |
| 6,153,126 A | 11/2000 | Kumar | 252/586 |
| 6,180,181 B1 | 1/2001 | Verardi et al. | 427/409 |
| 6,187,444 B1 | 2/2001 | Bowles, III et al. | 428/423.1 |
| 6,214,500 B1 | 4/2001 | Kumacheva et al. | 430/21 |
| 6,268,055 B1 | 7/2001 | Walters et al. | 428/413 |
| 6,281,272 B1 | 8/2001 | Baldy et al. | 523/501 |
| 6,291,564 B1 | 9/2001 | Faler et al. | 524/284 |
| 6,296,785 B1 | 10/2001 | Nelson et al. | 252/586 |
| 6,325,957 B1 | 12/2001 | Kumacheva et al. | 264/71 |
| 6,329,060 B1 | 12/2001 | Barkac et al. | 428/423.1 |
| 6,337,131 B1 | 1/2002 | Rupaner et al. | 428/403 |
| 6,338,808 B1 | 1/2002 | Kawata et al. | 252/299.4 |
| 6,348,604 B1 | 2/2002 | Nelson et al. | 549/389 |
| 6,353,102 B1 | 3/2002 | Kumar | 544/60 |
| 6,432,544 B1 | 8/2002 | Stewart et al. | 428/424.2 |
| 6,433,043 B1 | 8/2002 | Misura et al. | 523/456 |
| 6,436,525 B1 | 8/2002 | Welch et al. | 428/332 |
| 6,506,488 B1 | 1/2003 | Stewart et al. | 428/332 |
| 6,525,136 B1 | 2/2003 | Foucher et al. | 525/88 |

(Continued)

FOREIGN PATENT DOCUMENTS

EP    0277639 A2    2/1988

(Continued)

OTHER PUBLICATIONS

U.S. Appl. No. 10/846,629, entitled "Photochromic Compounds," filed on May 17, 2004.
U.S. Appl. No. 10/846,650, entitled "Polarizing, Photochromic Devices and Methods of Making the Same," filed May 17, 2004.
U.S. Appl. No. 10/846,603, entitled "Alignment Facilities for Optical Dyes ," filed May 17, 2004.
U.S. Appl. No. 10/757,267, entitled "Polarizing Devices and Methods of Making the Same," filed Januaray 14, 2004.
"Catalysts and Additives (Polyurethanes)," *Ullmann's Encyclopedia of Industrial Chemistry*, Completely Revised Fifth Edition, vol. A21, pp. 673-674, Section 3.5 (1992).
Haugland, R.P., *Molecular Probes Handbook for Fluorescent Probes and Research Chemicals, Molecular Probes, Handbook*, Sixth Edition (1996).

(Continued)

*Primary Examiner* — John Chu
(74) *Attorney, Agent, or Firm* — Frank P Mallak; Deborah M Altman

(57) ABSTRACT

Described are aqueous compositions of an effective amount of at least one photosensitive material and at least one polymerizable component that are adapted to at least partially form photosensitive microparticles or at least partially crosslinked photosensitive polymeric microparticles. The photosensitive polymeric microparticles are made of integral surface and interior domains wherein at least one of the surface and/or interior domains is photosensitive. Also described are aqueous dispersions of such microparticles, ways of producing such microparticles and photosensitive articles such as optical elements that incorporate the photosensitive polymeric microparticles.

78 Claims, No Drawings

U.S. PATENT DOCUMENTS

| | | | |
|---|---|---|---|
| 6,531,076 B2 | 3/2003 | Crano et al. | 252/586 |
| 6,555,028 B2 | 4/2003 | Walters et al. | 252/586 |
| 6,599,973 B1 | 7/2003 | Visscher et al. | 524/504 |
| 6,602,603 B2 | 8/2003 | Welch et al. | 428/412 |
| 6,607,994 B2 | 8/2003 | Soane et al. | 442/59 |
| 6,630,597 B1 | 10/2003 | Lin et al. | 549/389 |
| 6,641,874 B2 | 11/2003 | Kuntz et al. | 428/29 |
| 6,645,767 B1 | 11/2003 | Villa et al. | 435/483 |
| 6,687,266 B1 | 2/2004 | Ma et al. | 372/7 |
| 6,713,536 B2 | 3/2004 | Misura et al. | 523/456 |
| 6,733,887 B2 | 5/2004 | Okoroafor et al. | 428/423.3 |
| 7,261,843 B2 * | 8/2007 | Knox et al. | 252/586 |
| 2002/0039627 A1 | 4/2002 | Ichihashi et al. | 428/1.1 |
| 2002/0055007 A1 | 5/2002 | Soane et al. | 428/520 |
| 2002/0128339 A1 | 9/2002 | Maisonnier et al. | 521/65 |
| 2002/0143088 A1 | 10/2002 | Robert et al. | 524/379 |
| 2003/0086978 A1 | 5/2003 | Kim et al. | 424/591 |
| 2003/0109197 A1 | 6/2003 | Tolles | |
| 2003/0136948 A1 | 7/2003 | Welch et al. | 252/586 |
| 2003/0141490 A1 | 7/2003 | Walters et al. | 252/585 |
| 2003/0165686 A1 | 9/2003 | Blackburn et al. | 428/412 |
| 2003/0174560 A1 | 9/2003 | Dahmen et al. | 365/200 |
| 2005/0042758 A1 * | 2/2005 | Zyhowski et al. | 436/3 |

FOREIGN PATENT DOCUMENTS

| | | |
|---|---|---|
| JP | 64-29489 | 1/1989 |
| JP | 4-117483 | 4/1992 |
| JP | 6-256758 | 9/1994 |
| JP | 7-26027 | 1/1995 |
| JP | 7-62337 | 3/1995 |
| RU | 2095836 C1 | 10/1997 |
| WO | WO 98/37115 | 8/1998 |
| WO | WO 01/57106 A1 | 8/2001 |
| WO | WO 02/04535 A1 | 1/2002 |
| WO | WO 02/057070 A2 | 7/2002 |
| WO | WO 03/008009 A1 | 5/2003 |
| WO | WO 03/077033 A2 | 9/2003 |

OTHER PUBLICATIONS

D. Arivuoli, "Fundamentals of Nonlinear Optical Materials" *PRAMANA—Journal of Physics*, vol. 57, Nos. 5&6, Nov. & Dec. 2001, pp. 871-883.

Nalwa, H.S. and Miyata S. Editors, *Nonlinear Optics of Organic Molecules and Polymers*, CRC Press (1997).

"Chromogenic Materials (Inorganic Photochromic)", *Kirk Othmer Encyclopedia of Chemical Technology*, Fourth Edition, vol. 6, pp. 322-325, (2001).

"Photochromism", *Techniques of Chemistry*, vol. III, Glenn H. Brown, Editor, John Wiley and Sons, Inc., New York (1971).

"Electrically Conductive Polymers," *Kirk Othmer Encyclopedia of Chemical Technology*, Fourth Edition, vol. 9, pp. 61-68, (2001).

"Redox Polymerization" by G.S. Misra, *Prog. Polym. Sci.*, vol. 8, pp. 61-131 (1982).

"Preparation and optical properties of polystyrene nanocapsules containing photochromophores" by Mijeong Han et al., PITCAL Materials, Korea Research Institute of Chemical Technology, pp. 579-583 (2002).

"Nano-Encapsulation of Photochromic Compounds Using Diblock Copolymers" by Young J. Kim, et al., Polymer Preprints, pp. 1226-1227 (2002).

"Synthesis and Polymerization of Amphiphilic Methacrylates Containing Permanent Dipole Azobenzene Chromophores" by Angelina Altomare, et al., Journal of Polymer Science: Part A: Polymer Chemistry, vol. 39, pp. 22957-22977, John Wiley & Sons, Inc. (2001).

"Methacrylic polymers containing permanent dipole azobenzene chromophores spaced from the main chain. $^{13}$CNMR spectra and photochromic properties$^{a}$", Angelina Altomare, et al., University of Piza, Department of Chemistry, Macromol. Chem. Phys. 200, No. 3, pp. 601-608 (1998).

"Methacrylic Polymers Containing Permanent Dipole Azobenzene Chromophores Spaced from the Main Chain Synthesis and Characterization", Angelina Altomare, et al., Polymer International 47 pp. 419-427 (1998).

"Halographic Gratings in Azobenzene Side-Chain Polymethacrylates", Luisa Andruzzi, et al., American Chemical Society, Marcomolecules, pp. 448-454 (1999).

U.S. Appl. No. 60/482,167, filed Jun. 24, 2003, "Aqueous Dispersions of Microparticles Having a Nanoparticulate Phase and Coating Compositions Containing the Same".

U.S. Appl. No. 10/876,031, filed Jun. 24, 2004, "Aqueous Dispersions of Microparticles Having a Nanoparticulate Phase and Coating Compositions Containing the Same".

U.S. Appl. No. 10/876,291, filed Jun. 24, 2004, "Coated Articles and Multi-Layer Coatings".

U.S. Appl. No. 10/876,315, filed Jun. 24, 2004, "Nanoparticle Coatings for Flexible and/or Drawable Substrates".

* cited by examiner

METHODS FOR PRODUCING PHOTOSENSITIVE MICROPARTICLES, AQUEOUS COMPOSITIONS THEREOF AND ARTICLES PREPARED THEREWITH

BACKGROUND OF THE INVENTION

The present invention is directed to aqueous compositions for forming photosensitive microparticles to photosensitive polymeric microparticles and to methods for producing such microparticles. The present invention is also directed to aqueous dispersions of photosensitive polymeric microparticles and articles comprising the photosensitive polymeric microparticles.

Photosensitive materials demonstrate a response to electromagnetic radiation, including infrared, visible and ultraviolet radiation as well as light amplification by stimulated emission or laser. This response can be a type of luminescence in which visible radiation is emitted by a photosensitive material after exposure, e.g., fluorescent and phosphorescent materials; in which there is a change in the wavelength of the electromagnetic radiation passing through the material, e.g., non-linear optical materials; or in which there is a reversible change in color, e.g., photochromic materials.

There are products that take advantage of the phenomena demonstrated by photosensitive materials, e.g., optical elements such as optical memory elements and display elements. Although products incorporating core/shell microparticles that demonstrate photosensitive properties are known, it is desirable to have products in which the properties of the photosensitive materials in the microparticles can be controlled.

DETAILED DESCRIPTION OF THE INVENTION

As used in this specification and the appended claims, the singular forms "a," "an," and "the" include plural referents unless expressly and unequivocally limited to one referent.

For the purposes of this specification, unless otherwise indicated, all numbers expressing quantities of ingredients, reaction conditions, and other parameters used in the specification and claims are to be understood as being modified in all instances by the term "about". Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

All numerical ranges herein include all numerical values and ranges of all numerical values within the recited range of numerical values. Notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements.

The present invention includes various non-limiting embodiments. One such embodiment is an aqueous composition comprising an effective amount of at least one photosensitive material and at least one polymerizable component comprising at least one substantially hydrophilic monomer and at least one substantially hydrophobic monomer, the hydrophilic monomer and the hydrophobic monomer being adapted to combine and at least partially form microparticles of the polymerizable component with which the photosensitive material is associated. The term "monomer" includes single monomer units and oligomers that comprise a few monomer units. Another non-limiting embodiment provides an aqueous composition comprising an effective amount of at least one photosensitive material and at least one polymerizable component comprising at least one hydrophilic functional group and at least one hydrophobic functional group, the photosensitive material(s) and polymerizable component(s) being adapted to form at least partially crosslinked photosensitive polymeric microparticles. A further non-limiting embodiment provides an aqueous composition in which the photosensitive material is a photochromic material. In a still further non-limiting embodiment, the polymerizable component comprises at least one substantially hydrophilic prepolymer, at least one substantially hydrophobic prepolymer, and an effective amount of at least one organic photochromic material comprising at least one polymerizable group, the polymerizable component being adapted to form at least partially crosslinked photochromic polymeric microparticles.

In accordance with a further non-limiting embodiment, the polymerizable component can still further comprise a material that is copolymerizable with at least one of the substantially hydrophilic and substantially hydrophobic monomers, which material is hereinafter referred to as the "copolymerizable material". Moreover, the polymerizable component can possess functionality adapted to react with crosslinking materials, to be compatible with host materials and to have properties associated with the photosensitive polymeric microparticles described hereinafter.

The phrase "being adapted to combine and to at least partially form microparticles of the polymerizable component with which the photosensitive material is associated" refers to the polymerizable component being suitable to self assemble into at least partially formed microparticles. Self-assembly of the microparticles is due to the difference in the hydrophilicity and hydrophobicity associated with the hydrophilic functional group(s) of the substantially hydrophilic monomer and the hydrophobic functional group(s) of the substantially hydrophobic monomer comprising the polymerizable component. The photosensitive material can be associated with the microparticles by the selection of hydrophilic photosensitive material(s), hydrophobic photosensitive material(s) or photosensitive material having another property that allows it to chemically or physically associate with the resulting microparticles or the polymerizable component.

After formation of the microparticles, they are typically polymerized. The phrase "to at least partially polymerize and form at least partially crosslinked polymeric microparticles" refers to the polymerizable component in which from some to all of the monomers react and combine to form chain-like polymeric materials and the reactive groups on from some to all of these chain-like polymeric materials react and crosslink to form polymeric networks in which from some to all of the chains are interconnected. The aforementioned reactive groups are chemical groups capable of undergoing a polymerization reaction known to those skilled in the art. Non-limiting examples of such polymerizable groups include methacryloyloxy, acryloyloxy, vinyl, allyl, carboxyl, amino, mercapto, epoxy, hydroxy and isocyanato.

In accordance with one non-limiting embodiment, the aqueous compositions of the present invention comprise an amount of water that can vary widely. In one non-limiting example, the amount of water can range from 30 weight percent to an amount less than 100 weight percent, inclusive of all numerical values and ranges of all numerical values within this range, as specified hereinbefore for all numerical ranges cited herein. In another non-limiting embodiment, the aqueous composition can include organic solvents in amounts that can vary widely, e.g., a range from a positive amount less than 1 weight percent up to 70 weight percent. The weight percent of water and organic solvent are based on the weight of either water or solvent divided by the total weight of water and organic solvent (if present) multiplied by 100.

The types of organic solvents that can be included in the aqueous composition can vary widely. In one non-limiting embodiment, the aqueous composition can include polar solvents, such as alcohols, and nonpolar solvents such as hydrocarbon liquids. Non-limiting examples of organic solvents that can be included in the aqueous composition include propylene glycol monobutyl ether, ethylene glycol monohexyl ether, ethylene glycol monobutyl ether, diethylene glycol butyl ether, n-butanol, isopropanol, benzyl alcohol, mineral spirits, N-methylpyrrolidinone, toluene, TEXANOL® solvent which is reported to be 2,2,4-trimethyl-1,1,3-pentanediol monoisobutyrate and which is available from Eastman Chemical Co., and mixtures of such solvents. In a further non-limiting embodiment, the use of organic solvents can aid in the process of forming the crosslinked polymeric microparticles. If required, some or all of the organic solvent can be removed from the aqueous composition by methods known to those skilled in the art, e.g., via an azeotropic distillation or a reduced pressure distillation at temperatures of less than 40° C.

In another non-limiting embodiment, adjuvant materials can also be incorporated into the aqueous composition, e.g., conventional ingredients that aid in processing the polymerizable component or impart desired characteristics to the resulting microparticles. Non-limiting examples of such ingredients include rheology control agents, surfactants, initiators, catalysts, cure-inhibiting agents, reducing agents, acids, bases, preservatives, crosslinking materials, free radical donors, free radical scavengers, stabilizers such as ultraviolet and thermal stabilizers, and adhesion promoting agents, such as organofunctional silanes, siloxanes, titanates and zirconates, which adjuvant materials are known to those skilled in the art.

As previously stated, the aqueous composition comprises at least one polymerizable component comprising at least one substantially hydrophilic monomer and at least one substantially hydrophobic monomer. As used herein, the terms "substantially hydrophilic monomer" and "substantially hydrophobic monomer" refer to the relative hydrophilic or hydrophobic character of the monomers compared one to the other. The substantially hydrophilic monomer of the polymerizable component is more hydrophilic than the substantially hydrophobic monomer. Correspondingly, the substantially hydrophobic monomer of the polymerizable component is more hydrophobic than the substantially hydrophilic monomer. One method of determining the hydrophilic/hydrophobic character of a material is the well-known Hydrophilic-Lipophilic Balance (HLB) number. HLB numbers generally range from 1 to 20, with 1 being an oil-soluble material and 20 being a water-soluble material. Using this system, materials designated herein as substantially hydrophobic would demonstrate an HLB of less than 10 while materials designated as substantially hydrophilic would demonstrate an HLB of greater than 10.

The proportions of the substantially hydrophilic monomer(s) to the at substantially hydrophobic monomer(s) can vary widely. In one non-limiting embodiment, the weight percent of the substantially hydrophilic monomer and the substantially hydrophobic monomer in the polymerizable component can each range from 2 to 98 weight percent, based on the total polymerizable component solids weight of 100 percent. Non-limiting examples of proportions of substantially hydrophilic monomers to substantially hydrophobic monomers are 20:80 and 50:50.

In another non-limiting embodiment, the substantially hydrophilic monomer is substantially compatible with, has an affinity for, and/or is capable of at least partially dissolving in water using conventional mixing means. The substantially hydrophilic monomers used in the polymerizable monomer component of the present invention can comprise any hydrophilic monomer known to those skilled in the art. Non-limiting examples of such hydrophilic monomers include monomers comprising hydrophilic functional groups such as: acid-functional groups; hydroxyl-functional groups; nitrile-functional groups; amino-functional groups; amide-functional groups; carbamate-functional groups; ionic-functional groups such as quaternary ammonium or sulfonium groups; or mixtures of such functional groups.

In a still further non-limiting embodiment, the degree of hydrophilicity and hydrophobicity of the monomers used to prepare the polymerizable component can be varied, as is known to those skilled in the art. A substantially hydrophobic monomer of the polymerizable component can be converted into a substantially hydrophilic monomer. In one non-limiting embodiment, isocyanato groups on a hydrophobic monomer of the polymerizable component can be functionalized with siloxane groups by reacting the isocyanato groups with an organofunctional silane such as aminopropyl triethoxysilane. Upon dispersion in water, the hydrolyzable groups, e.g., alkoxysilanes, are at least partially hydrolyzed to form hydrophilic silanol groups. If allowed to react with alcohol or themselves, these hydrophilic groups can revert to hydrophobic groups. The same functionalization process can be preformed with available isocyanato groups on the polymerized and crosslinked photosensitive polymeric microparticles.

Non-limiting examples of suitable organo-functional silanes for such a hydrophobic to hydrophilic conversion process include: (3-acryloxypropyl)dimethylmethoxysilane, acryloxypropyltriethoxysilane, allytriethoxysilane, 4-aminobutyltriethoxysilane, carboxymethyltriethoxysilane, epoxybutyltrimethoxysilane, glycidoxypropyltrimethoxysilane, isocyanatopropyltriethoxysilane, 3-mercaptopropyltrimethoxysilane, mercaptomethylmethyl-diethoxysilane, methacryloxypropylmethyldimethoxysilane, (methacryloxymethyl)dimethylethoxysilane, methacryloxypropyltrimethoxysilane, strylethyltrimethoxysilane, ureidopropyltriethoxysilane, ureidopropyltrimethoxysilane, vinylmethyldiethoxysilane, vinyltriacetoxysilane, vinyltriethoxysilane or mixtures thereof.

In addition to organo-functional silanes, other substantially hydrophobic materials that can be made substantially hydrophilic include materials such as alkoxylated melamines, phenol-formaldehydes, urea-formaldehydes which upon acid catalysis in water form substantially hydrophilic groups, as is known to those skilled in the art.

Non-limiting examples of hydrophilic acid-functional group-containing monomers include acrylic acid, methacrylic acid, beta-carboxyethyl acrylate, acryloxypropionic acid, 2-acrylamide methylpropane sulfonic acid, acrylic(3-sulfopropyl)ester acids, crotonic acid, dimethylolpropionic acid, fumaric acid, mono($C_1$-$C_{17}$)alkyl esters of fumaric acid, maleic acid, mono($C_1$-$C_{17}$)alkyl esters of maleic acid, itaconic acid, mono($C_1$-$C_{17}$)alkyl esters of itaconic acid and mixtures thereof.

Non-limiting examples of hydrophilic hydroxyl-functional group-containing monomers include 2-hydroxyethyl methacrylate, 2-hydroxyethyl acrylate, hydroxypropyl methacrylate, hydroxypropyl acrylate, hydroxybutyl methacrylate, hydroxybutyl acrylate, hydroxymethyl ethyl acrylate, hydroxy methylpropyl acrylate, dicaprolactone acrylate, diethanolamine, dimethanolamine or mixtures thereof. Non-limiting examples of nitrile-functional group-containing monomers include methacrylonitriles and acrylonitriles.

Non-limiting examples of hydrophilic amino-functional group-containing monomers include allylamine, dimethlallylamine, 2-(dimethylamino)ethyl methacrylate, 2-(t-butylamino)ethyl methacrylate, 4-aminostyrene, dimethylaminoethyl vinyl ether, and N-(3-dimethylaminopropyl) methacrylamide.

Non-limiting examples of hydrophilic ionic-functional group-containing monomers include allyltrimethylammonium chloride, 2-trimethylammonium ethyl acrylic chloride, and vinylbenzyl dimethyl sulfonium chloride.

Non-limiting examples of hydrophilic amide-functional group-containing monomers include methacrylamides and acrylamides.

Non-limiting examples of hydrophilic carbamate-functional group-containing monomers include allyl carbamate, vinyl carbamate, the reaction product of hydroxyethyl carbamate and methacrylic anhydride, and the reaction product of hydroxyethyl carbamate with isophorone di-isocyanate and hydroxyethyl acrylate.

Non-limiting examples of hydrophilic vinyl-functional group-containing monomers include vinyl acetate, vinyl pyrrolidones and vinyl propionates.

In one non-limiting embodiment, the hydrophobic monomer(s) comprise a monomer that is substantially free of hydrophilic functionality and is substantially incompatible with, has less affinity for and/or is capable of only minimally dissolving in water using conventional mixing means. In another non-limiting embodiment, the hydrophobic monomer(s) used in the polymerizable component of the present invention can include any hydrophobic monomer known to those skilled in the art. Non-limiting examples of hydrophobic functional groups include hydrocarbons having 4 or more carbon atoms. Further examples of such functional groups are included in the description of hydrophobic monomers hereinafter.

Non-limiting examples of hydrophobic monomers include free-radically polymerizable monomers which include, but are not limited to, vinyl aromatic monomers, e.g., styrene, α-methyl styrene, t-butyl styrene and vinyl toluene; vinyl and vinylidene halides, e.g., vinyl chloride and vinylidene chloride; vinyl esters; vinyl ethers, vinyl butyrates, alkyl esters of acrylic and methacrylic acids having from 4 to 17 carbon atoms in the alkyl group, including butyl methacrylate, butyl acrylate, cyclohexyl methacrylate, cyclohexyl acrylate, 2-ethylhexyl methacrylate, 2-ethylhexyl acrylate, butyl hexylmethacrylate, butyl hexylacrylate, isooctylmethacrylate, isooctylacrylate, isodecyl methacrylate, isodecyl acrylate, isobornyl methacrylate, isobornyl acrylate, lauryl methacrylate and lauryl acrylate; and mixtures thereof.

Other suitable hydrophobic monomers include organofunctional silanes having substantially non-hydrolyzable substituents, such as alkoxy groups having 3 or more carbon atoms.

In one non-limiting embodiment, the polymerizable component comprises at least one copolymerizable material that is different from the at least one substantially hydrophilic monomer and the at least one substantially hydrophobic monomer. In another non-limiting embodiment, the copolymerizable material(s) can be reacted with the substantially hydrophilic monomer(s) to form a substantially hydrophilic prepolymer and/or with the substantially hydrophobic monomer(s) to form a substantially hydrophobic prepolymer.

In another non-limiting embodiment, the copolymerizable material(s) can be any material that is copolymerizable with at least one of the substantially hydrophilic monomer(s) and the substantially hydrophobic monomer(s). In one non-limiting embodiment, the copolymerizable material(s) is a structural backbone forming material. Non-limiting examples of copolymerizable material(s) can be chosen from: ethylenically unsaturated group-containing materials; isocyanate-containing materials known to those skilled in the art, e.g., reaction products of isocyanates and other correspondingly reactive materials, e.g., polyols, in which the reaction product has at least one reactive isocyanato group; hydroxyl-group containing monomers known to those skilled in the art; epoxy-group containing monomers known to those skilled in the art; carboxy-group containing monomers known to those skilled in the art; carbonate-group containing monomers known to those skilled in the art, e.g., a reaction product of a polyol comprising at least one carbonate group and vinyl monomer and a reaction product of a polyol comprising at least one carbonate group and an isocyanate comprising one reactive isocyanate group and at least one polymerizable double bond as described in U.S. Patent Application Publication U.S. 2003/0136948 paragraphs [0041] to [0065], which disclosure is incorporated herein by reference; or mixtures of such copolymerizable materials.

In one non-limiting embodiment, the copolymerizable material(s) includes silyl-group containing materials, e.g. organo-functional silanes having at least one polymerizable group, such as the previously described organo-functional silanes.

Non-limiting examples of copolymerizable materials such as ethylenically unsaturated group-containing monomers include vinyl monomers and ethylenically unsaturated monomers having a functional group chosen from hydroxyl, carboxyl, amino, mercapto, (meth)acryloyloxy, e.g., methacryloyloxy or acryloyloxy, isocyanato or mixtures thereof, which are known to those skilled in the art. In one non-limiting embodiment, the copolymerizable materials can have two or more of the same polymerizable group or two or more of different polymerizable groups. In another non-limiting embodiment, the copolymerizable material is chosen from (meth)acrylic monomers having at least one functional group chosen from hydroxyl, amino, mercapto or mixtures thereof.

In one non-limiting embodiment, the substantially hydrophilic monomer(s) and/or the substantially hydrophobic monomer(s) used in the formation of the polymerizable component are chosen for the properties provided by the glass transition temperatures of the respective polymers upon polymerization, as is known to those skilled in the art. For example, monomers that form polymers having glass transition temperatures higher than room temperature, e.g. 23° C., tend to form rigid or hard polymers while monomers that form polymers having glass transition temperatures less than room temperature tend to be soft and flexible. The properties of the monomers used to form the polymeric microparticle environment can affect the performance of the photosensitive materials. For example, in the case of organic photochromic materials that depend on conformational changes to demonstrate an activated and unactivated state, in one non-limiting embodiment, a soft and flexible environment permits more movement and can allow an increase in performance or a rigid and hard environment permits less movement and can cause a decrease in performance. Formulating the polymerizable component with materials having properties that can affect the performance of the photosensitive materials enables the resulting photosensitive polymeric microparticle to have an environment in which the performance of the photosensitive materials can be controlled.

Upon polymerization, the substantially hydrophilic monomer(s) and the substantially hydrophobic monomer(s) each form polymers, the glass transition temperatures of which can vary widely. In one non-limiting embodiment, the glass transition temperature of a polymer formed upon polymerization of the substantially hydrophobic monomer(s) is greater than or equal to the glass transition temperature of the polymer formed upon polymerization of the substantially hydrophilic monomer(s). In an alternate non-limiting embodiment, the glass transition temperature of the polymer formed upon polymerization of the substantially hydrophobic monomer(s) is less than the glass transition temperature of the polymer formed upon polymerization of the substantially hydrophilic monomer(s).

In a further non-limiting embodiment, the substantially hydrophobic monomer(s) is adapted to form a polymer that upon polymerization has a glass transition temperature less than 23° C., e.g., from 22.9° C. to −100° C. or from 22° C. to −90° C. In a still further non-limiting embodiment, the substantially hydrophilic monomer(s) is adapted to form a polymer that upon polymerization has a glass transition temperature equal to or greater than 23° C., e.g., from 23° C. to 130° C. or from 24° C. to 100° C.

In a still further non-limiting embodiment, the substantially hydrophilic monomer(s) and/or the substantially hydrophobic monomer(s) can be urethane materials adapted to form substantially rigid and/or substantially flexible segments. The concept of preparing urethane material in order to form rigid or flexible segments by choosing the components, e.g., isocyanates and polyols, to form the appropriate type of segment is known to those skilled in the art. See for example the discussion of hard and soft segments in U.S. Pat. No. 6,187,444 at column 3, line 49 to column 4, line 46, which disclosure is incorporated herein by reference. A rigid segment of urethane material is one that gives the resulting material in which it is used a stiffness that is not easily bent without breaking. A flexible segment of urethane material is one that results in a material being pliable and capable of being bent or moved from a straight line or form without breaking. In one non-limiting embodiment, the substantially hydrophobic monomer is a urethane material, e.g., a urethane (meth)acrylate prepolymer, that is adapted to form a flexible-segment and the substantially hydrophilic monomer(s) is a urethane material, e.g., a urethane (meth)acrylate prepolymer, adapted to form a rigid-segment. In an alternate non-limiting embodiment, the substantially hydrophobic monomer(s) is a urethane material that is adapted to form a rigid-segment and the substantially hydrophilic monomer(s) is a urethane material adapted to form a flexible-segment.

The urethane materials of the present invention can be prepared with isocyanates and polyols, amines and/or thiols that can vary widely. Suitable materials and methods are known to those skilled in the art of urethane preparation.

When the urethane-forming components, such as organic components having hydroxyl, mercapto and/or amino groups and isocyanates, are combined to produce the urethane materials of the present invention, the relative amounts of the ingredients are typically expressed as a ratio of the available number of reactive isocyanate groups to the available number of reactive hydroxyl, mercapto and/or amino groups, e.g., an equivalent ratio of NCO:X wherein X is OH, SH, NH and/or $NH_2$. For example, a ratio of NCO:X of 1.0:1.0 is obtained when the weight of one NCO equivalent of the isocyanate component is reacted with the weight of one X equivalent of the hydroxyl, mercapto and/or amino group-containing component. The urethane materials have an equivalent ratio of NCO:X that can vary widely. For example, in one non-limiting embodiment, the equivalent ratio of NCO:X can range between 0.3:1.0 and 3.0:1.0 and all inclusive ranges therebetween. When the ratio is greater than 1.0:1.0, the excess isocyanato groups can be blocked and/or further reacted, e.g., with urea or organo-functional silanes, to form hydrophilic groups, as is known to those skilled in the art.

Non-limiting examples of isocyanate components include modified or unmodified isocyanates having free, blocked, e.g., with suitable blocking agents, or partially blocked isocyanate-containing components, as known to those skilled in the art, chosen from: toluene-2,4-diisocyanate; toluene-2,6-diisocyanate; diphenyl methane-4,4'-diisocyanate; diphenyl methane-2,4'-diisocyanate; para-phenylene diisocyanate; biphenyl diisocyanate; 3,3'-dimethyl-4,4'-diphenylene diisocyanate; tetramethylene-1,4-diisocyanate; hexamethylene-1,6-diisocyanate; 2,2,4-trimethyl hexane-1,6-diisocyanate; lysine methyl ester diisocyanate; bis (isocyanato ethyl)fumarate; isophorone diisocyanate; ethylene diisocyanate; dodecane-1,12-diisocyanate; cyclobutane-1,3-diisocyanate; 2-heptyl-3,4-bis(9-isocyanatononyl)-1-pentyl-cyclohexane; cyclohexane-1,3-diisocyanate; cyclohexane-1,4-diisocyanate; dicyclohexylmethane-4,4-diisocyanate or methylene bis (4-cyclohexylisocyanate); methyl cyclohexyl diisocyanate; hexahydrotoluene-2,4-diisocyanate; hexahydrotoluene-2,6-diisocyanate; hexahydrophenylene-1,3-diisocyanate; hexahydrophenylene-1,4-diisocyanate; m-tetramethylxylene diisocyanate; p-tetramethylxylene diisocyanate; perhydrodiphenylmethane-2,4'-diisocyanate; perhydrodiphenylmethane4,4'-diisocyanate or mixtures thereof.

In a further non-limiting embodiment, when the urethane material is formed in the presence of a catalyst, the catalyst can be chosen from: Lewis bases, Lewis acids and insertion catalysts, as is described in *Ullmann's Encyclopedia of Industrial Chemistry*, 5th Edition, 1992, Volume A21, pp. 673 to 674, which disclosure is incorporated herein by reference.

Non-limiting examples of organic polyols that can be used in the present invention as urethane-forming components include (a) polycarbonate polyols; (b) low molecular weight polyols, e.g., polyols having a weight average molecular weight less than 500, e.g., aliphatic diols, such as $C_2$-$C_{10}$ aliphatic diols, triols, polyhydric alcohols and alkoxylated low molecular weight polyols; (c) polyester polyols; (d) polyether polyols; (e) amide-containing polyols; (f) polyacrylic polyols; (g) epoxy polyols; (h) polyhydric polyvinyl alcohols; (i) urethane polyols; or (j) mixtures thereof. The aforementioned polycarbonate polyols can be formed by methods known in the art, as disclosed in U.S. Pat. No. 5,143,997 at column 3, line 43 to column 6, line 25, and U.S. Pat. No. 5,527,879 at column 2, line 10 to column 3, line 48. The other polyols can also be prepared by methods known in the art, as described in U.S. Pat. No. 6,187,444 at column 7, line 25 to column 12, line 15. Such disclosures are hereby incorporated herein by reference.

In one non-limiting embodiment, the organic polyols, e.g., diols, triol, etc., that are used to prepare the urethane material of the present invention, can be used to form prepolymers or adducts with the isocyanates. In another non-limiting embodiment, substantially hydrophilic or substantially hydrophobic prepolymers can each be prepared by the reaction of a hydrophilic monomer, such as dimethylol propionic acid, or a hydrophobic monomer, such as a $C_8$ aliphatic diol, with the isocyanate reactive group of the prepolymer. Such prepolymers can be substantially hydrophilic or substantially hydrophobic urethane (meth)acrylate prepolymers, e.g., urethane acrylate prepolymers, urethane methacrylate prepolymers or a mixture thereof.

As previously stated, the aqueous compositions of the present invention include an effective amount of at least one photosensitive material. The term "an effective amount of photosensitive material" means that amount of photosensitive material in the polymerizable component and resulting photosensitive polymeric microparticle which, when irradiated with an appropriate wavelength of electromagnetic radiation, produces a detectable response by instrument or visual observation such as a change in the wavelength or amount of radiation emitted by the photosensitive material, a change in the wavelength of the radiation passing through the photosensitive material or a change in the observed color of the photosensitive material. The term "photosensitive materials" includes photosensitive organic materials, photosensitive inorganic materials or mixtures thereof, but does not include colorants such as pigments and fixed tint dyes and conventional dichroic dyes unless the dichroic property is associated with a photochromic material as discussed hereinafter. In one non-limiting embodiment, the photosensitive material is chosen from fluorescent dyes, phosphorescent dyes, nonlinear optical materials, photochromic materials or mixtures thereof.

In another non-limiting embodiment, the photosensitive material(s) further comprises one or more polymerizable groups described hereinbefore. Various methods for attaching polymerizable groups to photosensitive materials are known to those skilled in the art. See for example, U.S. Pat. No. 6,113,814 at column 8, line 42 to column 22, line 7, which disclosure is incorporated herein by reference. Additional methods that can be employed are those used for attaching functional groups to non-photosensitive materials, such as the methods described in U.S. Pat. No. 5,919,846 at column 2, line 35 to column 4, line 42. The photosensitive material, in one non-limiting embodiment, can be at least partially bound to the chain-like polymeric materials of the polymerizable component.

As known to those skilled in the art, fluorescent and phosphorescent dyes emit visible radiation when an atom or molecule passes from a higher to a lower electronic state. The difference between the two dyes being that the emission of luminescence after exposure to radiation from the fluorescent dye occurs sooner than that from a phosphorescent dye.

Fluorescent dyes known to those skilled in the art can be used as photosensitive materials in the present invention. See Haugland, R. P. (1996) *Molecular Probes Handbook for Fluorescent Probes and Research Chemicals,* 6th edition. Non-limiting examples of fluorescent dyes include anthracenes, tetracenes, pentacenes, rhodamines, benzophenones, coumarins, fluoresceins, perylenes and mixtures thereof.

Phosphorescent dyes known to those skilled in the art can be used as photosensitive materials in the present invention. Non-limiting examples of phosphorescent dyes include: metal-ligand complexes such as tris(2-phenypyridine)iridium [Ir(ppy)3]; 2,3,7,8,12,13,17,18-octaethyl-21H,23H-porphyrin platinum (II) [PtOEP] and organic dyes such as eosin (2',4',5',7'-tetrabromofluorescein), 2,2'-bipyridine and erythrosin (2',4',5',7'-tetraiodofluorescein).

Non-linear optical materials (NLO) can have a distinct crystalline structure, which is optically anisotropic with respect to electromagnetic radiation, but can also be amorphous, e.g., gallium arsenate, as well as polymeric incorporating a variety of chromophores such as disperse red 1 [2873-52-8] 4-(N-ethyl-N-2-hydroxyethyl)amino-4'-nitroazobenzene. As used herein the term "anisotropic" means having at least one property that differs in value when measured in at least one different direction. Thus, "optically anisotropic materials" are materials that have at least one optical property that differs in value when measured in at least one different direction. Based on the anisotropic nature of NLO materials, ordering or alignment of the materials, as known to those skilled in the art, is used to take full advantage of the nonlinear behavior of these materials. Some NLO materials change light passing through them, depending upon orientation, temperature, light wavelength etc. A non-limiting example of this property of NLO materials is that a red light of low wavelength enters a crystal of ammonium dihydrogen phosphate which releases photons of accumulated higher energy and exits as blue light of a higher wavelength. See, D. Arivuoli "Fundamentals of nonlinear optical materials" PRAMANA-journal of physics Vol 57, Nos 5 &6 November & December 2001, pp. 871-883, which disclosure is incorporated herein by reference.

NLO materials known to those skilled in the art can be used as photosensitive materials in the present invention. See Nalwa, H. S. and Miyata, S, Editors, *Nonlinear Optics of Organic Molecules and Polymers* by CRC, 1997. Non-limiting examples of NLO materials in addition to the aforementioned materials include: 4-dimethylamine-4-nitrostilbene; 4-[4-(phenylazo)-1-naphthylazo]phenol; N-ethyl-N-(2-hydroxyethyl)-4-(4-nitrophenylazo)aniline; and (S)-(−)-1-(4-nitrophenyl)-2-pyrrolidinemethanol.

Photochromic materials have at least two states, a first state having a first absorption spectrum and a second state having a second absorption spectrum that differs from the first absorption spectrum, and are capable of switching between the two states in response to at least actinic radiation of at least two different wavelengths. For example, Isomer A of a photochromic material at the first absorption spectrum, e.g., a "clear" state, is exposed to light of a first wavelength and isomerizes to Isomer B at the second absorption spectrum, e.g., a "colored" state, which when exposed to light of a second and different wavelength or when exposure to the light of a first wavelength is discontinued isomerizes back to Isomer A. Typically, photochromic materials in the clear state are considered as "unactivated" and in the colored state, are "activated." Within the class of photochromic materials, there are thermally reversible and non-thermally reversible photochromic materials. Thermally reversible photochromic materials are capable of switching between a first and a second state in response to at least actinic radiation and reverting back to the first state in response to thermal energy, e.g., any form of heat, or removal of the activating radiation. Non-thermally reversible (or photo-reversible) photochromic materials are adapted to switch states in response to actinic radiation, but not thermal energy. As used herein "actinic radiation" means electromagnetic radiation, such as but not limited to ultraviolet and visible radiation that is capable of causing a response in photochromic materials.

In a further non-limiting embodiment, both thermally reversible and non-thermally reversible photochromic materials can be adapted to display both photochromic and dichroic, e.g., at least partially linearly polarizing, properties under appropriate conditions and are referred to as photochromic-dichroic materials. As used herein, "at least partially linearly polarizing" means to confine from some to all of the vibrations of the electric field vector of lightwaves to one direction or plane. As discussed below in more detail, the photosensitive articles comprising optically anisotropic materials such as non-linear optical materials and/or photochromic-dichroic materials can be at least partially aligned.

Non-limiting examples of photochromic materials include a wide variety of photochromic materials that can be used as photosensitive materials in the present invention. In one non-limiting embodiment, the photochromic material is chosen from an inorganic photochromic material, an organic photochromic material or a mixture thereof.

In one non-limiting embodiment, the inorganic photochromic material comprises crystallites of silver halide, cadmium halide and/or copper halide. Other non-limiting inorganic photochromic materials can be prepared by the addition of europium (II) and/or cerium(III) to a mineral glass such as a soda-silica glass. In one non-limiting embodiment, the inorganic photochromic materials are added to molten glass and formed into particles that are incorporated into the aqueous composition of the present invention to form microparticles comprising such particulates. The glass particulates can be formed by any of a number of various methods known in the art. The inorganic photochromic materials are further described in *Kirk Othmer Encyclopedia of Chemical Technology*, 4th Edition, Volume 6, pages 322-325.

In another non-limiting embodiment, the photochromic material is at least one organic photochromic material comprising at least one activated absorption maxima in the range from 300 to 1000 nanometers, as is known to those skilled in the art. In a further non-limiting embodiment, the organic photochromic material comprises a mixture of (a) at least one organic photochromic material having a visible lambda max of from 400 to less than 550 nanometers, and (b) at least one organic photochromic material having a visible lambda max of from 550 to 700 nanometers.

In a further non-limiting embodiment, the photochromic material can include the following classes of materials: pyrans, oxazines, fulgides, fulgimides, diarylethenes or mixtures thereof. According to various non-limiting embodiments disclosed herein, the photochromic material(s) can be a thermally reversible photochromic material and/or a non-thermally reversible photochromic material. According to one non-limiting embodiment, the photochromic material(s) is chosen from thermally reversible pyrans, thermally reversible oxazines, thermally reversible fulgides, thermally reversible fulgimides or mixtures thereof. According to another non-limiting embodiment, the photochromic material(s) is a non-thermally reversible fulgide, non-thermally reversible fulgimide, non-thermally reversible diarylethene or a mixture thereof. According to further non-limiting embodiments, the photochromic material is a photochromic-dichroic material.

Non-limiting examples of photochromic pyrans that can be used herein include benzopyrans, and naphthopyrans, e.g., naphtho[1,2-b]pyrans, naphtho[2,1-b]pyrans, and indeno-fused naphthopyrans, such as those disclosed in U.S. Pat. No. 5,645,767 at column 2, line 16 to column 12, line 57, and heterocyclic-fused naphthopyrans, such as those disclosed in U.S. Pat. No. 5,723,072 at column 2, line 27 to column 15, line 55, U.S. Pat. No. 5,698,141 at column 2, line 11 to column 19, line 45, U.S. Pat. No. 6,153,126 at column 2, line 26 to column 8, line 60, and U.S. Pat. No. 6,022,497 at column 2, line 21 to column 11, line 46, which disclosures are hereby incorporated herein by reference, and spiro-9-fluoreno[1,2-b]pyrans, phenanthropyrans, quinolinopyrans; fluoroanthenopyrans and spiropyrans, e.g., spiro(benzindoline) naphthopyrans, spiro(indoline)benzopyrans, spiro(indoline) naphthopyrans, spiro(indoline)quinolinopyrans and spiro (indoline)pyrans. More specific examples of naphthopyrans and complementary organic photochromic substances are described in U.S. Pat. No. 5,658,501 at column 1, line 64 to column 13, line 17, which disclosure is hereby incorporated herein by reference. Spiro(indoline)pyrans are also described in the text, Techniques in Chemistry, Volume III, "Photochromism", Chapter 3, Glenn H. Brown, Editor, John Wiley and Sons, Inc., New York, 1971, which is also hereby incorporated herein by reference.

Non-limiting examples of photochromic oxazines that can be used in conjunction with various non-limiting embodiments disclosed herein include benzoxazines, naphthoxazines, and spiro-oxazines, e.g., spiro(indoline)naphthoxazines, spiro(indoline)pyridobenzoxazines, spiro (benzindoline)pyridobenzoxazines, spiro(benzindoline) naphthoxazines, spiro(indoline)benzoxazines, spiro (indoline)fluoranthenoxazine, and spiro(indoline) quinoxazine.

Non-limiting examples of thermally reversible photochromic fulgides or fulgimides that can be used in conjunction with various non-limiting embodiments disclosed herein include: fulgides and fulgimides, which are disclosed in U.S. Pat. No. 4,685,783 at column 1, line 57 to column 5, line 27, the disclosure of which is hereby incorporated herein by reference, and mixtures of any of the aforementioned photochromic materials/compounds.

According to one specific, non-limiting embodiment, wherein the photochromic material comprises at least two photochromic compounds, the photochromic compounds can be linked to one another via linking group substituents on the individual photochromic compounds. For example, the photochromic materials can be polymerizable photochromic compounds or photochromic compounds that are adapted to be compatible with a host material ("compatibilized photochromic materials"). Non-limiting examples of polymerizable photochromic materials that can be used in conjunction with various non-limiting embodiments disclosed herein are disclosed in U.S. Pat. No. 6,113,814 at column 2, line 23 to column 23, line 29, which disclosure is hereby incorporated herein by reference. Non-limiting examples of compatiblized photochromic materials that can be used in conjunction with various non-limiting embodiments disclosed herein are disclosed in U.S. Pat. No. 6,555,028 at column 2, line 40 to column 25, line 26, which disclosure is hereby incorporated herein by reference. In one non-limiting embodiment, a polymerizable photochromic material that is substantially hydrophilic can be used as the substantially hydrophilic monomer in the polymerizable component. In another non-limiting embodiment, a polymerizable photochromic material that is substantially hydrophobic can be used as the substantially hydrophobic monomer in the polymerizable component.

Other suitable photochromic groups and complementary photochromic groups are described in U.S. Pat. No. 6,080,338 at column 2, line 21 to column 14, line 43; U.S. Pat. No. 6,136,968 at column 2, line 43 to column 20, line 67; U.S. Pat. No. 6,296,785 at column 2, line 47 to column 31, line 5; U.S. Pat. No. 6,348,604 at column 3, line 26 to column 17, line 15; U.S. Pat. No. 6,353,102 at column 1, line 62 to column 11, line 64; and U.S. Pat. No. 6,630,597 at column 2, line 16 to column 16, line 23. The aforesaid disclosures of the aforementioned patents are hereby incorporated herein by reference.

Still further suitable photochromic materials include photochromic-dichroic materials, such as the materials disclosed in U.S. Patent Application Serial No. P-108,936 from paragraph [0020] to [0134], filed May 17, 2004, which disclosure is incorporated herein by reference. Such material can be used to provide polarizing properties to microparticles that are at least partially aligned as described hereinafter. Non-limiting examples of such photochromic-dichroic compounds include:

(1) 3-phenyl-3-(4-(4-(3-piperidin-4-yl-propyl)piperidino) phenyl)-13,13-dimethyl-indeno[2',3':3,4]-naphtho[1,2-b] pyran;
(2) 3-phenyl-3-(4-(4-(3-(1-(2-hydroxyethyl)piperidin-4-yl) propyl)piperidino)phenyl)-13,13-dimethyl-indeno[2',3':3,4]naphtho[1,2-b]pyran;
(3) 3-phenyl-3-(4-(4-(4-butyl-phenylcarbamoyl)-piperidin-1-yl) phenyl)-13,13-dimethyl-6-methoxy-7-(4-phenyl-piperazin-1-yl)indeno[2',3':3,4] naphtho[1,2-b]pyran;
(4) 3-phenyl-3-(4-([1,4']bipiperidinyl-1'-yl)phenyl)-13,13-dimethyl-6-methoxy-7-([1,4']bipiperidinyl-1'-yl)indeno [2',3':3,4]naphtho[1,2-b]pyran;
(5) 3-phenyl-3-(4-(4-phenyl-piperazin-1-yl)phenyl)-13,13-dimethyl-6-methoxy-7-(4-(4-hexylbenzoyloxy)-piperidin-1-yl)indeno[2',3':3,4] naphtho[1,2-b]pyran; or
(6) mixtures of such pyrans.

In addition to the aforementioned photochromic materials, a non-limiting example of non-thermally reversible diarylethene photochromic material is described in U.S. Patent Application 2003/0174560 from paragraph [0025] to [0086], and a non-thermally reversible fulgide or fungimide is described in U.S. Pat. No. 5,631,382 at column 2, line 35 to column 12, line 8, which disclosures are hereby incorporated herein by reference.

In a further non-limiting embodiment, the photosensitive material is a photochromic material comprising a pyran chosen from:

(a) 3,3-di(4-methoxyphenyl)-6,11,13-trimethyl-13-(2-(2-(2-hydroxyethoxy)ethoxy)ethoxy)-3H, 13H-indeno[2,1-f]naphtho[1,2-b]pyran;
(b) 3-phenyl-3-(4-morpholinophenyl)-6,7-dimethoxy-13-butyl-13-(2-(2-(2-hydroxyethoxy)ethoxy)ethoxy)-3H, 13H-indeno[2,1-f]naphtho[1,2-b]pyran;
(c) 3,3-di(4-methoxyphenyl)-6-methoxy-7-morpholino-13-ethyl-13-(2-(2-hydroxyethoxy)ethoxy)-3H, 13H-indeno[2,1-f]naphtho[1,2-b]pyran;
(d) 3-(4-(2-hydroxyethoxy)phenyl)-3-(4-morpholinophenyl)-13,13-dimethyl-3H,13H-indeno[2,1-f]naphtho[1,2-b]pyran;
(e) 3-(4-methoxyphenyl)-3-(4-fluorophenyl)-6,7-dimethoxy-13-ethyl-13-(2-(2-hydroxyethoxy) ethoxy)-)-3H,13H-indeno[2,1-f]naphtho[1,2-b]pyran;
(f) 3,3-di(4-methoxyphenyl)-6,11,13-trimethyl-13-hydroxy-3H, 13H-indeno[2,1-f]naphtho[1,2-b]pyran; or
(g) mixtures of such pyrans.

Methods of making photochromic materials with and without at least one polymerizable group are well known to those skilled in the art. For example, and without limitation, 3,3-di (4-methoxyphenyl)-6,11,13-trimethyl-13-(2-(2-(2-hydroxyethoxy)ethoxy)ethoxy-3H,13H-indeno[2,1-f]naphtho[1,2-b] pyran (Photochromic Material A), can be prepared by following the process of Example 8 of U.S. Pat. No. 6,113, 814, which example is incorporated herein by reference, except that in Step 7 of the process, triethylene glycol is used in place of diethylene glycol.

In a further non-limiting embodiment, a photochromic material, such as 3-phenyl-3-(4-morpholinophenyl)-6,7-dimethoxy-13-butyl-13-(2-(2-(2-hydroxyethoxy)ethoxy) ethoxy-3H,13H-indeno[2,1-f]naphtho[1,2-b]pyran (Photochromic Material B), can be prepared by using the same process as described above for Photochromic Material A, except that the product of Example 16 in U.S. Pat. No. 6,296, 785, (which example is hereby incorporated herein by reference) is used in Step 7 of Example 8 of U.S. Pat. No. 6,113, 814.

In a still further non-limiting embodiment, a photochromic material, such as 3,3-di(4-methoxyphenyl)-6-methoxy-7-morpholino-13-ethyl-13-(2-(2-hydroxyethoxy)ethoxy)-3H, 13H-indeno[2,1-f]naphtho[1,2-b]pyran (Photochromic Material C), can be prepared by reacting 2-morpholino-3-methoxy-5,7-dihydroxy-7-ethyl-7H-benzo[C]fluorene, which can be prepared by following Step 2 of Example 9 of U.S. Pat. No. 6,296,785 using the appropriately substituted starting material (which example is hereby incorporated herein by reference) with 1,1-bis(4-methoxyphenyl)-2-propyn-1-ol, which can be prepared by following the method of Step 1 of Example 1 of U.S. Pat. No. 5,458,814 (which example is hereby incorporated herein by reference) using procedures known to those skilled in the art.

In another non-limiting embodiment, a photochromic material, such as (d) 3-(4-(2-hydroxyethoxy)-phenyl-3-(4-morpholinophenyl)-13,13-dimethyl-3H,13H-indeno[2,1-f] naphtho[1,2-b]pyran (Photochromic Material D), can be prepared by reacting 7,7-dimethyl-5-hydroxy-7H-benzo[C] fluorene with 1-(4-(2-hydroxyethoxy)-phenyl-1-(4-morpholinophenyl)-2-propyn-1-ol using procedures known to those skilled in the art.

Similarly, in a further non-limiting embodiment, a photochromic material, such as 3-(4-fluorophenyl)-3-(4-methoxyphenyl)-6,7-dimethoxy-13-ethyl-13-(2-(2-hydroxyethoxy) ethoxy)-3H,13H-indeno[2,1-f]naphtho[1,2-b]pyran (Photochromic Material E), can be prepared by following the process used for Photochromic Material A except by using 3-(4-fluorophenyl)-3-(4-methoxyphenyl)-6,7-dimethoxy-13-ethyl-13-hydroxy-3H,13H-indeno[2,1-f]naphtho[1,2-b] pyran and diethylene glycol in the process.

In another non-limiting embodiment, a photochromic material, such as (f) 3,3-di (4-methoxyphenyl)-6,11,13-trimethyl-13-hydroxy-3H,13H-indeno[2,1-f]naphtho[1,2-b]pyran (Photochromic Material F), can be prepared by following the method of Example 5 of U.S. Pat. No. 5,645,767, which example is incorporated herein by reference.

The photosensitive materials described herein can be chosen from a variety of materials. Non-limiting examples include: a single photosensitive compound; a mixture of photosensitive compounds; a material comprising at least one photosensitive compound, such as a polymeric resin or an organic monomeric solution; a material such as a monomer or polymer to which at least one photosensitive compound is chemically bonded; a photosensitive polymer, e.g., a photochromic polymer comprising photochromic compounds bonded together; or mixtures thereof.

In one non-limiting embodiment, when the photosensitive material is an organic photochromic material comprising at least one polymerizable group and the copolymerizable material is present, the polymerizable component comprises from 2 to 25 weight percent of substantially hydrophilic prepolymer, from 2 to 25 weight percent of substantially hydrophobic prepolymer, from 1 to 45 weight percent of the photochromic material and from 5 to 95 weight percent of one or more copolymerizable monomers, based on the total weight of solids of the polymerizable component being 100 percent. In another non-limiting embodiment, the polymerizable component comprises from 10 to 25 weight percent of substantially hydrophilic prepolymer, from 10 to 25 weight percent of substantially hydrophobic prepolymer, from 5 to 15 weight percent of the photochromic material and from 35 to 75 weight percent of one or more copolymerizable monomers. The individual components of the polymerizable component can each range in all numerical amounts between any combination of their respective ranges inclusive of the aforestated ranges. In one non-limiting embodiment, the organic photochromic is present in an amount of up to 50 weight percent of the total weight of solids of the polymerizable component.

Further non-limiting embodiments of the present invention are at least partially crosslinked photosensitive polymeric microparticles comprising an at least partially polymerized component comprising integral surface and interior domains wherein said surface domain comprises at least one substantially hydrophilic region, said interior domain comprises at least one substantially hydrophobic region, and at least one of said surface and/or interior domains is photosensitive. In a further non-limiting embodiment, the surface and/or interior domain that is photosensitive comprises an effective amount of at least one photosensitive material chosen from fluorescent materials, phosphorescent materials, nonlinear optical materials, photochromic materials or mixtures thereof. In a further non-limiting embodiment, the interior domain is adapted to be photosensitive. In a still further non-limiting embodiment, the photosensitive material is substantially non-extractable and in yet another non-limiting embodiment, the photosensitive material is a photochromic material.

The at least partially crosslinked polymeric microparticles are formed by the self-assembly and partial polymerization of the polymerizable component in an aqueous environment. During self-assembly of the microparticles, the substantially hydrophilic regions orient to the exterior and form the surface domain and the substantially hydrophobic regions orient to the interior and forms the interior domain. As used herein the terms "surface domain" means the contiguous region of the outside of the microparticles and "interior domain" comprises the contiguous region of the inside of the microparticles, all of which domains are integral.

In a still further non-limiting embodiment, the at least one photosensitive material is adapted to be substantially non-extractable. In another non-limiting embodiment, the non-extractable photosensitive material is a photochromic material. In a further non-limiting embodiment, the photochromic material is an organic photochromic material and in a still further non-limiting embodiment, the organic photochromic material is substituted with at least one polymerizable group. By substantially non-extractable is meant that a microparticle of substantially non-extractable photosensitive material will release less photosensitive material than a microparticle of an identical photosensitive material that is substantially extractable since measures to prevent extraction were not taken, e.g., providing the photosensitive material with at least one polymerizable group capable of reacting with the polymerizable component as described hereinafter.

The relative extractability of photosensitive materials from the photosensitive polymeric microparticles (using organic photochromic materials as an example) can be tested by including an effective amount of the photochromic polymeric microparticles of a substantially non-extractable photochromic material, such as Photochromic A described herein before, which has at least one polymerizable group capable of reacting with the polymerizable component, in one portion of a coating composition of the film-forming type used in the examples and including an effective amount of photochromic polymeric microparticles of a substantially extractable photochromic material, such as Photochromic F described herein before, which does not have a polymerizable group capable of reacting with the polymerizable component, in another portion of the coating composition. The term "effective amount" in this illustration means that a sufficient amount of photochromic polymeric microparticles are used to produce a photochromic effect discernible to the naked eye upon activation. The coating compositions containing each type of photochromic polymeric microparticles are applied as at least partial coatings to lenses and at least partially cured as described in the examples herein. The at least partially cured coated lenses as well as an uncoated lens of the same material are each measured for their absorbance at a suitable wavelength, e.g., 390 nanometers (nm), to measure the initial amounts of photochromic materials as well as the absorbance of the lens material. The absorbance of the uncoated lens is subtracted from the absorbance of each of the coated lenses to account for the ultraviolet stabilizers typically present in such lens material. The coated lenses as well as an uncoated lens are immersed in separate containers of equivalent amounts of a solvent in which the photosensitive material is at least partially soluble, such as tetrahydrofuran (THF) which solvent is maintained at 23° C., e.g., room temperature. At intervals of 30 minutes, each of the lenses is removed, dried and tested for their absorbance at 390 nm and the absorbance of the uncoated lens is subtracted from each of the at least partially coated lenses. This is continued until the absorbance readings for the coated lenses do not significantly change indicating that the extractable amount of photochromic material has been extracted.

Regarding the photosensitive polymeric microparticles of the present invention, in one non-limiting embodiment, the amount of substantially non-extractable photosensitive material released from the photosensitive polymeric microparticles in comparison to the amount of extractable photosensitive material released by the photosensitive polymeric microparticles can vary from slightly less to significantly less. Stated another way, microparticles containing substantially non-extractable photosensitive materials can release from 10% less to 100% less photosensitive material than the microparticles containing extractable photochromic materials.

In another non-limiting embodiment, the photosensitive material can be made substantially non-extractable by trapping due to its being trapped within the resulting polymeric network of the at least partially crosslinked polymeric microparticle as a result of the size of the photosensitive material. For example, in one non-limiting embodiment, a particulate photosensitive material, e.g., a glass particulate comprising inorganic photochromic materials, or a photochromic oligomer or photochromic polymer having a number average weight and/or configuration which would be expected to be trapped by size. In another non-limiting embodiment, the photosensitive material is at least partially bound to the polymeric network by covalent bonds, e.g., by at least one functional group reactive with the surface and/or interior domains. In a further non-limiting embodiment, the photosensitive material is held by a combination of factors including physical size, hydrogen bonding and covalent bonding.

In one non-limiting embodiment, it has been observed that substantially non-extractable organic photosensitive materials, e.g., organic photochromic materials, remain in the physical phase in which they were added. For example, the substantially non-extractable organic photochromic materials associated with the substantially hydrophobic region of the interior domain do not tend to migrate into the substantially hydrophilic region of the surface domain and crystallize.

The size of the photosensitive polymeric microparticles of the present invention can vary widely. For example, in alternate non-limiting embodiments, the size of the microparticles of the present invention can range from an average particle size, e.g., a volume average particle size as determined by a laser diffraction particle size instrument that measures the size of the particles assuming that each particle has a spherical shape, yielding a "particle size" referring to the diameter of the smallest sphere that will completely enclose the particle, of from 10 to 10,000 nanometers (nm) or from 20 to 5000 nm or from 30 to 1500 nm or from 40 to 1000 nm or from 50 to 500 nm or from 60 to 200 nm. The average particle size of the photosensitive polymeric microparticles have a range that varies between any of the aforementioned values, inclusive of the recited values, e.g., from 60 to 120 nm.

When the average particle size of the photosensitive polymeric microparticles is less than 50 nm, the size can be determined by ultraviolet or X-ray-laser scattering methods, atomic force microscopy, neutron scattering or other methods known to those skilled in the art. When the average particle size is greater than 50 nanometers and up to 1000 nm, the average particle size can be measured according to known visible-laser scattering techniques or it can be determined by visually examining an electron micrograph of a transmission electron microscopy ("TEM") image, measuring the diameter of the particles in the image, and calculating the average particle size based on the magnification of the TEM image. When the average particle size is greater than 1000 nm, the size can be measured by using light microscope methods known to those skilled in the art.

In a further non-limiting embodiment, the aforementioned photosensitive polymeric microparticles comprise functionality adapted to react with crosslinking materials. Such functionality also enables the photosensitive polymeric microparticles to react with components of host materials, e.g., polymeric organic materials, to make the photosensitive polymeric microparticles more compatible with the host. By the term "more compatible" is meant that the combination of the photosensitive polymeric microparticles and host material would be less likely to demonstrate cloudiness or haze, which is a typical indication of a lack of compatibility. In one non-limiting embodiment, at least a portion of the functionality adapted to react is hydrophilic for example, hydroxyl and carboxyl functional groups. Non-limiting examples of functional groups include: hydroxyl, carboxyl, epoxy, carbamate, amino, mercapto, amide and/or urea groups.

In regards to the crosslinking materials, in one non-limiting embodiment, the crosslinking materials are chosen from: materials comprising two or more sites of reactive unsaturation; materials comprising two or more of the aforementioned functional groups; materials comprising one or more sites of reactive unsaturation and one or more of the aforementioned functional groups: or mixtures of such crosslinking materials. Non-limiting examples of crosslinking materials for hydroxyl, carboxyl, amide, and carbamate functional group containing materials include aminoplast resins, phenoplast resins or mixtures thereof. Non-limiting examples of aminoplast resins are commercially available from CYTEC Industries, Inc., under the trademark CYMEL, e.g., CYMEL® 327, 328, 345, 350, 370 and 385 and from Monsanto Chemical Co. under the trademark RESIMENE In another non-limiting embodiment, polyisocyanates and blocked polyisocyanates and polyaziridines can be used as crosslinking materials for hydroxyl and primary and/or secondary amino group-containing materials. Non-limiting examples of polyisocyanates and blocked isocyanates suitable for use as crosslinking agents for the photosensitive microparticles of the present invention are those described in U.S. Pat. No. 4,546,045 at col. 5, lines 16 to 38; and in U.S. Pat. No. 5,468,802 at col. 3, lines 48 to 60, which disclosures are hereby incorporated herein by reference.

Non-limiting examples of crosslinking materials for hydroxyl and primary and/or secondary amino groups include anhydrides that are well known in the art. Non-limiting examples of anhydrides suitable for use as crosslinking materials are those described in U.S. Pat. No. 4,798,746 at col. 10, lines 16 to 50; and in U.S. Pat. No. 4,732,790 at col. 3, lines 41 to 57, which disclosures are hereby incorporated herein by reference.

Non-limiting examples of crosslinking materials for carboxyl functional groups include polyepoxides and carbodiimides, such as the materials sold under the trademark CARBODILITE that are manufactured by Nisshinbo Industries, Inc of Japan.

Non-limiting examples of crosslinking materials for epoxy functional group containing materials are polyacids that are well known in the art. Non-limiting examples of polyacids suitable for use as crosslinking materials are those described in U.S. Pat. No. 4,681,811 at col. 6, line 45 to col. 9, line 54, which disclosure is hereby incorporated herein by reference.

Non-limiting examples of crosslinking materials for carbonates and unhindered esters include polyamines that are well known in the art. Examples of polyamines suitable for use as crosslinking materials for the photosensitive polymeric microparticles of the present invention are those described in U.S. Pat. No. 4,046,729 at col. 6, line 61 to col. 7, line 26, which disclosure is hereby incorporated herein by reference.

Non-limiting examples of crosslinking materials for hydroxyl functional group containing materials include siloxanes, silanes and/or hydrolysates of each that are typical components of hardcoat producing coating solutions such as Hi-Gard® coating solutions, sold by PPG Industries, Inc. Further non-limiting examples include silyl substituted materials such as tris[3(trimethoxysilyl)propyl]isocyanurate, which are well known in the art.

When desired and appropriate, mixtures of the aforementioned crosslinking materials can be used.

In a series of further non-limiting embodiments, reactivity with crosslinking materials and additional physical properties, such as those described hereinafter, can be associated with the photosensitive polymeric microparticles of the present invention. The microparticles can be adapted to have these properties by incorporation of materials conferring such properties during the formation of the polymerizable component and/or after formation of the at least partially crosslinked photosensitive polymeric microparticles.

In one non-limiting embodiment, the photosensitive polymeric microparticle is adapted to be magnetic or magnetically responsive by the introduction of magnetic materials and/or magnetically responsive metal oxides during and/or after preparation of the microparticles. Non-limiting examples of such materials include superparamagnetic metal oxides, paramagnetic metal oxides, ferromagnetic metal oxides, e.g. ferrite, or mixtures thereof, as known by those skilled in the art. Magnetic particulates are commercially available from Dynal Biotech or can be prepared using art-recognized methods, such as those disclosed in, for example, U.S. Pat. No. 4,358,388 at column 1, line 42 to column 7, line 39, and U.S. Pat. No. 5,356,713 at column 1, line 47 to column 5, line 12, which disclosures are hereby incorporated herein by reference.

In another non-limiting embodiment, the photosensitive polymeric microparticles can be electrically conductive by incorporating electrically conductive materials into the photosensitive polymeric microparticles. In one non-limiting embodiment, electrically conductive fillers, such as carbon fillers, carbon blacks or metal fibers can be incorporated during and/or after preparation of the microparticles. The amount of electrically conductive material added can vary widely provided that the percolation threshold, e.g., the concentration of filler at which the microparticles will conduct an electrical current, is met or exceeded. In another non-limiting embodiment, electrically conductive polymers can be incorporated into the microparticle by including monomers of such polymers in the polymerizable component. Non-limiting examples of conductive polymers include: polyaniline-based polymers, polypyrrole-based polymers, polythiophene—based polymers, polyethyleneoxide-based polymers or copolymers thereof. The preparation and use of electrically conductive materials can be accomplished using techniques well known to those skilled in the art. See *Kirk Othmer Encyclopedia of Chemical Technology*, Fourth Edition, Volume 9, "Electrically Conductive Polymers," pages 61-88, which disclosure is hereby incorporated herein by reference.

In a further non-limiting embodiment, coloration can be incorporated within the photosensitive polymeric microparticles by the introduction of non-photosensitive dyes and/or pigments into the polymerizable component and/or microparticles to make the microparticles chromatic. Non-limiting examples of non-photosensitive dyes and pigments include a wide variety of organic or inorganic materials known to those skilled in the art. Non-limiting examples of non-photosensitive dyes include fixed tints such as soluble and dispersible tints. Non-limiting examples of pigments include organic metal oxides, and powders and organic pigments such as animal, vegetable or synthetic pigments. The aforementioned non-photosensitive organic dyes and pigments can also be polymerizable as discussed hereinafter using dichroic materials as an example.

Non-limiting examples of organic pigments, include quinacridones, phthalocyanines, isoindolines, anthrapyrimidines, anthanthrones, flavanthrones, perinones, pyranthrones, substituted derivatives thereof, and mixtures thereof. Non-limiting examples of inorganic pigments include titanium dioxide, iron oxide, chromium oxide, lead chromate, carbon black or mixtures thereof.

In a still further non-limiting embodiment, the photosensitive polymeric microparticles of the present invention can be made at least partially polarizing by incorporating photochromic-dichroic materials, as previously described, and/or conventional dichroic materials and at least partially aligning them. Dichroic materials are capable of absorbing one of two orthogonal plane polarized components of transmitted radiation more strongly than the other. Thus, dichroic materials are capable of at least partially linearly polarizing transmitted radiation. However, although dichroic materials are capable of preferentially absorbing one of two orthogonal plane polarized components of transmitted radiation, if the molecules of the dichroic compound are not suitably positioned or arranged, no net linear polarization of transmitted radiation will be achieved. That is, due to the random positioning of the molecules of the dichroic material, selective absorption by the individual molecules will cancel each other such that no net or overall linear polarizing effect is achieved. Thus, it is generally necessary to suitably position or arrange, e.g., at least partially align, the molecules of a dichroic material within another material in order to form a conventional linear polarizing element. For example by the stretching of a polymeric sheet to align the dichroic material to produce a linearly polarizing filter or lens for sunglasses, as is known to those skilled in the art.

Non-limiting examples of suitable conventional dichroic materials include azomethines, indigoids, thioindigoids, merocyanines, indans, quinophthalonic dyes, perylenes, phthaloperines, triphenodioxazines, indoloquinoxalines, imidazo-triazines, tetrazines, azo and (poly)azo dyes, benzoquinones, naphthoquinones, anthroquinone and (poly)anthroquinones, anthropyrimidinones, iodine and iodates. In another non-limiting embodiment, the dichroic material can be a polymerizable dichroic material. That is, according to this non-limiting embodiment, the dichroic material can comprise at least one polymerizable group. For example, although not limiting herein, the at least one dichroic material can have at least one alkoxy, polyalkoxy, alkyl, or polyalkyl substituent terminated with at least one polymerizable group.

According to another embodiment of the present invention, a non-limiting method is provided for producing photosensitive microparticles comprising: a) establishing an aqueous dispersion of an effective amount of at least one photosensitive material and at least one polymerizable component comprising at least one hydrophilic functional group and at least one hydrophobic functional group; and b) subjecting the dispersion of a) to conditions sufficient to at least partially form microparticles, which conditions are described hereinafter. In another non-limiting embodiment, the method further comprises: c) at least partially polymerizing the at least one polymerizable component of b). In a further non-limiting method, the photosensitive material is a photochromic material.

In another non-limiting embodiment of the aforementioned method, the hydrophilic functional group is provided by at least one substantially hydrophilic monomer and the hydrophobic functional group is provided by at least one substantially hydrophobic monomer. In a further non-limiting embodiment, the polymerizable component further comprises at least one copolymerizable material that is different from the substantially hydrophilic monomer or the substantially hydrophobic monomer.

An alternate non-limiting method is provided for producing photosensitive microparticles comprising: a) establishing an aqueous dispersion of at least one substantially hydrophilic prepolymer component, optionally comprising an effective amount of at least one photosensitive material; b) establishing an aqueous dispersion of at least one substantially hydrophobic prepolymer component, optionally comprising an effective amount of at least one photosensitive material; and c) subjecting a mixture of a) and b) to conditions sufficient to at least partially form microparticles, which conditions are described hereinafter, wherein said microparticles comprise an effective amount of at least one photosensitive material. In one non-limiting embodiment, the method further comprises adding a co-polymerizable material to the mixture of a) and b) in c). In another non-limiting embodiment, the method further comprises: d) at least partially polymerizing the polymerizable components of c). As used herein, the term "prepolymer" means a partially polymerized material.

In a further non-limiting embodiment of the aforementioned alternate method, the substantially hydrophilic prepolymer comprises substantially hydrophilic ethylenically unsaturated monomer(s) in an aqueous composition, the substantially hydrophobic prepolymer comprises substantially hydrophobic ethylenically unsaturated monomer(s) in an aqueous composition, and the photosensitive material is a photochromic material. In a still further non-limiting embodiment, the photochromic material is present in the substantially hydrophobic prepolymer and the photochromic material is an organic photochromic material. In yet a further non-limiting embodiment, the organic photochromic material comprises at least one polymerizable group.

In another non-limiting embodiment, the phrase "subjecting a material to conditions sufficient to at least partially form microparticles" includes subjecting the material to high shearing stress conditions to particularize the material into microparticles. The high shearing stress can be accomplished by any of the high shearing stress techniques known to those skilled in the art.

As used herein, the term "high shearing stress conditions" is meant to include not only high shearing stress techniques, such as the liquid-liquid impingement techniques discussed in detail below, but also high speed shearing by mechanical means. It should be understood that, if desired, any mode of applying stress to the aqueous composition can be utilized so long as sufficient stress is applied to achieve particularization of the aqueous composition to form microparticles.

The aqueous composition can be subjected to the appropriate shearing stress conditions by use of a MICROFLUIDIZER® emulsifier which is available from Microfluidics Corporation in Newton, Mass. The MICROFLUIDIZER® high-pressure impingement emulsifier is described in detail in U.S. Pat. No. 4,533,254, which is incorporated herein by reference. The device consists of a high-pressure (up to about $1.4 \times 10^5$ kPa (20,000 psi)) pump and an interaction chamber in which emulsification takes place. In one non-limiting embodiment, a pre-emulsion of the admixture is prepared prior to subjecting it to high shearing stress. The pump forces the admixture into the chamber where it is split into at least two streams which pass at very high velocity through at least two slits and collide, resulting in the formation of small particles, e.g., the admixture is "particularized".

In one non-limiting embodiment, each aqueous composition is passed through the emulsifier at a pressure of between about $3.5 \times 10^4$ and about $1 \times 10^5$ kPa (5,000 and 15,000 psi) multiple times or until at least partially formed microparticles are produced. In another non-limiting embodiment, multiple passes of each of the aqueous compositions within the emulsifier can result in microparticles having a smaller average particle size and a narrower range for the particle size distribution. When using the aforesaid MICROFLUIDIZER® emulsifier, stress is applied by liquid-liquid impingement. As mentioned above, other modes of applying stress to the pre-emulsification admixture can be utilized so long as sufficient stress is applied to achieve at least partially formed microparticles which can be further reduced in size by multiple passes. For example, alternative non-limiting methods of applying high shearing stress conditions would be the use of ultrasonic energy, homogenizers, rotor/stator mixers and/or jet dispersers.

In a further non-limiting embodiment, polymerization of the polymerizable components of the at least partially formed photosensitive polymeric microparticles can be accomplished by irradiating the composition with an initiating amount of radiation and/or adding to the composition an initiating amount of material e.g., an initiator, capable of enabling polymerization to occur by methods such as free radical polymerization, thermal polymerization, photopolymerization or a combination thereof. Methods for polymerizing the materials used to prepare the photosensitive polymeric microparticles of the present invention are well known to the skilled artisan and any of those well known techniques can be used.

For example, the polymerizable components can be at least partially polymerized by thermal polymerization, e.g. at temperatures ranging from 22° C. to 150° C., by photopolymerization or by a combination of the two methods. While a range of temperatures has been described for the thermal polymerization of the polymerizable components in the at least partially formed microparticles, it will be recognized by persons skilled in the art that temperatures other than those disclosed herein may be used.

Non-limiting methods for initiating polymerization by irradiation include the use of ultraviolet, visible, infrared, microwave, gamma or electron beam radiation so as to initiate the polymerization reaction of the polymerizable components. This can be followed by a thermal step to cure any unreacted polymerizable materials.

Polymerization of the polymerizable components can be done by including in the aqueous composition an initiating amount of material capable of generating free radicals, such as organic peroxy compounds or azobis(organonitrile) compounds, e.g., an initiator. Non-limiting examples of suitable organic peroxy compounds, that can be used as thermal polymerization initiators include: t-butyl hydroperoxide, peroxymonocarbonate esters, such as tertiarybutylperoxy isopropyl carbonate; peroxydicarbonate esters, such as di(2-ethylhexyl) peroxydicarbonate, di(secondary butyl) peroxydicarbonate and diisopropylperoxydicarbonate; diacylperoxides, such as 2,4-dichlorobenzoyl peroxide, isobutyryl peroxide, decanoyl peroxide, lauroyl peroxide, propionyl peroxide, acetyl peroxide, benzoyl peroxide, p-chlorobenzoyl peroxide; peroxyesters such as t-butylperoxy pivalate, t-butylperoxy octylate, and t-butylperoxyisobutyrate; methylethylketone peroxide, and acetylcyclohexane sulfonyl peroxide. In one non-limiting embodiment, the thermal initiators are those that do not discolor the resulting polymeric microparticle and can participate in an oxidation-reduction initiator system that does not require additional heat, as known to those skilled in the art. See, for example, "Redox Polymerization" by G. S. Misra, Prog. Polym. Sci. Vol 8, pp. 61-131, 1982, which disclosure is incorporated herein by reference.

Non-limiting examples of suitable azobis(organonitrile) compounds, that can be used as thermal polymerization initiators include: 2,2'-azobis(2,4-dimethylpentanenitrile, 1,1'-azobiscyclohexanecarbonitrile, azobisisobutyronitrile or mixtures thereof.

The amount of thermal polymerization initiator used to initiate and polymerize the polymerizable components can vary and will depend on the particular initiator used. Only that amount that is required to initiate and sustain the polymerization reaction is required. With respect to azobis(organonitrile) compounds, in one non-limiting embodiment, between 0.01 and 5.0 parts of that initiator per 100 parts of the polymerizable components (phm) can be used. Typically, the thermal cure cycle involves heating the polymerizable components in the presence of the initiator to temperatures in a range from room temperature up to 125° C. over a period of from 20 minutes to 2 hours. While a range of time has been described for thermal polymerization of the polymerizable components in the at least partially formed microparticles, it will be recognized by persons skilled in the art that time intervals other than those disclosed herein can be used.

Photopolymerization of the polymerizable components can be carried out in the presence of a photoinitiator using ultraviolet light and/or visible light. Non-limiting examples of photoinitiators that can be used according to various non-limiting embodiments disclosed herein include cleavage-type photoinitiators and abstraction-type photoinitiators.

Non-limiting examples of cleavage-type photoinitiators include acetophenones, α-aminoalkylphenones, benzoin ethers, benzoyl oximes, acylphosphine oxides and bisacylphosphine oxides or mixtures of such initiators. A commercial example of such a photoinitiator is DAROCURE® 4265, which is available from Ciba Chemicals, Inc. Non-limiting examples of abstraction-type photoinitiators include benzophenone, Michler's ketone, thioxanthone, anthraquinone, camphorquinone, fluorone, ketocoumarin or mixtures of such initiators.

Abstraction-type photoinitiators typically function better in the presence of materials such as amines and other hydrogen donor materials added to provide labile hydrogen atoms for abstraction. Typical hydrogen donors have an active hydrogen positioned alpha to an oxygen or nitrogen, e.g., alcohols, ethers and tertiary amines, or an active hydrogen atom directly attached to sulfur, e.g., thiols. In the absence of such added materials, photoinitiation can still occur via hydrogen abstraction from monomers, oligomers or other components of the system.

In another non-limiting embodiment, cationic photoinitiators can also be used in conjunction with the aforementioned photoinitiators. Non-limiting examples of cationic initiators used with abstraction type photoinitiators are hydrogen donor materials such as butyryl choline triphenylbutyl borate, or combinations of such materials. Further non-limiting examples of cationic photoinitiators are onium salts described in U.S. Pat. No. 5,639,802, column 8, line 59 to column 10, line 46, which disclosure is incorporated herein by reference.

The amount of photopolymerization initiator used to initiate and polymerize the polymerizable components of the at least partially formed microparticles can vary and will depend on the particular initiator used. Only that amount that is required to initiate and sustain the polymerization reaction is required. The photopolymerization initiator can be used in amounts of from 0.01% to 5% by weight, based on the weight of polymerizable components.

The light source used for the photopolymerization is selected from those which emit ultraviolet light and/or visible light. In one non-limiting embodiment, the light source can be a mercury lamp, a mercury lamp doped with $FeI_3$ and/or $GaI_3$, a germicidal lamp, a xenon lamp, a tungsten lamp, a metal halide lamp or a combination of such lamps. Typically, the absorbance spectra of the photoinitiator or photoinitiator combination is matched with the spectral output of the bulb, for example, H bulb, D bulb, Q bulb and/or V bulb for highest curing efficiency. The exposure time can vary depending upon the wavelength and intensity of the light source, the photoinitiator, and the polymerizable components. The at least partially formed microparticles can also be at least partially polymerized by using an electron beam process which does not require the presence of an initiator.

A further description of initiators and methods for the polymerization of the polymerizable components in the photosensitive microparticles using thermal and/or photopolymerization methods is disclosed in U.S. Pat. No. 6,602,603 at column 11, line 1 to column 13, line 36, which disclosure is incorporated herein by reference.

In one non-limiting embodiment, the present invention is directed to an aqueous dispersion of the at least partially crosslinked photosensitive polymeric microparticles of the present invention. In a further non-limiting embodiment, the photosensitive polymeric microparticles resulting from the aforedescribed processes can be prepared as a substantially stable aqueous dispersion or as an unstabilized aqueous composition. The term "substantially stable dispersion" means that the majority, e.g., greater than 50 percent, of photosensitive polymeric microparticles do not settle, coagulate and/or flocculate upon standing. An unstablized aqueous composition is one in which more than 50 percent of the photosensitive polymeric microparticles settle upon standing. In some cases, a surfactant or dispersant can be present to stabilize the dispersion, as is known to one skilled in the art. It should be understood that, for purposes of the present invention, the amount of surfactant necessary to produce a stable dispersion of microparticles, when desired, often can be minimized by the use of other ingredients that facilitate stability of the dispersion. For example, in one non-limiting embodiment, a polymer containing acid functionality that can be neutralized with an amine to form a water-dispersible polymer can be used to disperse other ingredients in the aqueous composition including the microparticles.

In a further embodiment of the present invention, photosensitive polymeric microparticles are recovered from the aqueous composition. In one non-limiting embodiment, liquid-solid separation techniques known to those skilled in the art are used. Non-limiting examples include filtration, centrifugation, flocculation and evaporative techniques. In another non-limiting embodiment, when a mass of at least partially crosslinked photosensitive microparticles is recovered; the mass can be dispersed by vibratory disruption. In a further non-limiting embodiment, the recovered microparticles can be treated electrostatically and/or chemically to minimize re-agglomeration by methods known to those skilled in the art of handling bulk solids.

In one non-limiting embodiment of the present invention, a photosensitive polymeric article is provided comprising the photosensitive polymeric microparticles of the present invention alone or with an at least partially cured polymeric material described hereinafter. In another non-limiting embodiment, the photosensitive article is an optical element. In a further non-limiting embodiment, the optical element is chosen from optical memory elements, display elements, ophthalmic elements, window elements or mirror elements. In a still further non-limiting embodiment, the photosensitive article is an ophthalmic element. In yet a further non-limiting embodiment, the photosensitive article is a photochromic article comprising the at least partially crosslinked photochromic polymeric microparticles of the present invention.

In another non-limiting embodiment, the photochromic article of the present invention comprises an at least partially cured polymeric organic material and an effective amount of at least partially crosslinked photochromic polymeric microparticles of the present invention wherein at least one of the surface and/or interior domains of the microparticle is photochromic. In one non-limiting embodiment, the polymeric organic material can be chosen from thermosetting polymeric organic materials, thermoplastic polymeric organic materials or a mixture of such polymeric organic materials. In another non-limiting embodiment, the polymeric organic material is chosen from poly($C_1$-$C_{12}$ alkyl methacrylates), poly(oxyalkylene dimethacrylates), poly(alkoxylated phenol methacrylates), cellulose acetate, cellulose triacetate, cellulose acetate propionate, cellulose acetate butyrate, poly(vinyl acetate), poly(vinyl alcohol), poly(vinyl chloride), poly(vinylidene chloride), thermoplastic polycarbonates, polyesters, polyurethanes, polythiourethanes, polysulfithiourethanes, poly(urea-urethane), poly(ethylene terephthalate), polystyrene, poly(alpha methylstyrene), copoly(styrene-methylmethacrylate), copoly(styrene-acrylonitrile), polyvinylbutyral or polymers prepared from bis(allyl carbonate) monomers, polyfunctional acrylate monomers, polyfunctional methacrylate monomers, diethylene glycol dimethacrylate monomers, diisopropenyl benzene monomers, ethoxylated bisphenol A dimethacrylate monomers, ethylene glycol bismethacrylate monomers, poly(ethylene glycol) bismethacrylate monomers, ethoxylated phenol bis methacrylate monomers, alkoxylated polyhydric alcohol polyacrylate monomers, styrene monomers, urethane acrylate monomers, glycidyl acrylate monomers, glycidyl methacrylate monomers, diallylidene pentaerythritol monomers or mixtures of such monomers.

In one non-limiting embodiment of the present invention, optical elements include: optical memory elements such as devices for optical memory and image processing; ophthalmic elements such as corrective lenses, non-corrective lenses, contact lenses, intra-ocular lenses, magnifying lenses, protective lenses and visors; window elements such as architectural, automotive, motorcycle and aircraft transparencies, filters, shutters, and optical switches; mirror elements; and display elements such as screens, monitors, liquid crystal cells, organic light emitting devices and security elements.

As used herein the term "optical" means pertaining to or associated with light and/or vision. In one non-limiting embodiment, the optical memory elements include image processing devices and optical data storage devices. In such optical memory elements the interaction of the device with optical signals causes a change in the optical memory of those devices for a period of time until the change in the form of an image is processed or maintained or until the change in the form of information is maintained until further changed or deleted. As used herein the term "ophthalmic" means pertaining to or associated with the eye and vision. Non-limiting examples of ophthalmic elements include corrective and non-corrective lenses, including single vision or multi-vision lenses, which may be either segmented or non-segmented multi-vision lenses (such as, but not limited to, bifocal lenses, trifocal lenses and progressive lenses), as well as other elements used to correct, protect, or enhance (cosmetically or otherwise) vision, including without limitation, contact lenses, intra-ocular lenses, magnifying lenses, and protective lenses or visors.

As used herein the term "window" means an aperture adapted to permit the transmission of radiation therethrough. Non-limiting examples of windows include architectural, automotive and aircraft transparencies, filters, shutters, and optical switches. As used herein the term "mirror element" means a surface that specularly reflects a large fraction of incident light. In the present invention, the reflected light can be modified by the type of photosensitive polymeric microparticle connected to the mirror element.

As used herein the term "display" means the visible or machine-readable representation of information in words, numbers, symbols, designs or drawings. Non-limiting examples of display elements and devices include screens, monitors, liquid crystal cells, organic light emitting devices and security elements. As used herein the term "liquid crystal cell" refers to a structure containing a liquid crystal material that is an anisotropic material capable of being ordered. Active liquid crystal cells are cells wherein the liquid crystal material is capable of being switched between ordered and disordered states or between two ordered states by the application of an external force, such as electric or magnetic fields. Passive liquid crystal cells are cells wherein the liquid crystal material maintains an ordered state. One non-limiting example of an active liquid crystal cell element or device is a liquid crystal display.

As used herein the term "order" means bring into a suitable arrangement or position, such as by aligning with another structure or material, or by some other force or effect. Thus, as used herein the term "order" encompasses both contact methods of ordering a material, such as aligning with another structure or material, and non-contact methods of ordering a material, such as by exposure to an external force or effect. The term "order" also encompasses combinations of contact and non-contact methods.

Non-limiting examples of methods of at least partially ordering liquid crystal materials as well as other anisotropic materials such as nonlinear optical materials, photochromic dichroic materials as well as dichroic dyes, according to various non-limiting embodiments disclosed herein using liquid crystal material as an example, include exposing at least a portion of the liquid crystal material to at least one of: a magnetic field, an electric field, linearly polarized infrared radiation, linearly polarized ultraviolet radiation, linearly polarized visible radiation and a shear force.

In addition to the aforementioned methods of at least partially ordering a liquid crystal material, the liquid crystal materials according to various non-limiting embodiments disclosed herein can be at least partially ordered by aligning at least a portion of the liquid crystal material with another material or structure, such as an orientation facility. As used herein the term "orientation facility" means a mechanism that can facilitate the positioning of one or more other structures that are exposed, directly and/or indirectly, to at least a portion thereof. Further information on orientation facilities is disclosed in U.S. Patent Application P-108,935 from paragraphs [0153] to [0288] filed May 17, 2004 which disclosure is hereby incorporated herein by reference.

In one non-limiting embodiment of the present invention, an optical element is provided that comprises a) a first substrate having a first surface; b) a second substrate having a second surface, wherein the second surface of the second substrate is opposite the first surface of the first substrate; and c) a material positioned between said first surface and said second surface, said material comprising an effective amount of at least partially crosslinked photosensitive polymeric microparticles of the present invention. The material positioned between the first surface and the second surface, in one non-limiting embodiment, is physically separated from both surfaces or is in contact with at least one of the surfaces. In a further non-limiting embodiment, the material of c) is in contact with the first surface and second surface of the first and second substrates.

In another non-limiting embodiment, the optical element is chosen from optical memory elements, display elements, ophthalmic elements, window elements or mirror elements. In a further non-limiting embodiment, the display element is chosen from screens, monitors, liquid crystal cells, organic light emitting devices or security elements. In a still further non-limiting embodiment, the optical element is an organic light emitting device "OLED" wherein the first surface is an anode, the second surface is a cathode and the material positioned there between is an emissive material, said emissive material being in electrical contact with said anode and said cathode.

When a current is applied to the OLED, in one non-limiting embodiment, the anode injects holes and the cathode injects electrons into the emissive material comprising an effective amount of the photosensitive polymeric microparticles of the present invention. The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism as known to those skilled in the art. See, for example, U.S. Pat. No. 6,687,266 at column 2, line 47 to column 18, line 59, which disclosure is hereby incorporated herein by reference. In a further non-limiting embodiment, the at least partially crosslinked photosensitive polymeric microparticles comprise an effective amount of photosensitive materials chosen from fluorescent materials, phosphorescent materials or mixtures thereof.

Non-limiting examples of security elements include articles having an effective amount of the at least partially crosslinked photosensitive polymeric microparticles of the present invention that are incorporated into and/or connected to at least a portion of at least one surface of the article. The effective amount of photosensitive polymeric microparticles is an amount of such microparticles that enables authentication of the article. The effective amount of photosensitive microparticles can be localized in an authentication mark. Non-limiting examples of such security elements include without limitation: access cards and passes, e.g., tickets, badges, identification or membership cards, debit cards etc.; negotiable instruments and non-negotiable instruments, e.g., drafts, checks, bonds, notes, certificates of deposit, stock certificates, etc.; government documents, e.g., currency, licenses, identification cards, benefit cards, visas, passports, official certificates, deeds etc.; consumer goods, e.g., software, compact discs ("CDs"), digital-video discs ("DVDs"), appliances, consumer electronics, sporting goods, cars, etc.; credit cards; or merchandise tags, labels and packaging.

Although not limiting herein, according to another non-limiting embodiment, the security element can be connected to at least a portion of a substrate chosen from a transparent substrate and a reflective substrate. Alternatively, according to certain non-limiting embodiments wherein a reflective substrate is required, if the substrate is not reflective or sufficiently reflective for the intended application, a reflective material can be first applied to at least a portion of the substrate before the authentication mark is applied thereto. For example, an at least partially reflective aluminum coating can be applied to the at least a portion of the substrate prior to forming the security element thereon. Still further, a security element(s) can be connected to at least a portion of a substrate chosen from untinted substrates, tinted substrates, photochromic substrates, tinted-photochromic substrates, an at least partially linearly polarizing, an at least partially circularly polarizing substrates, and an at least partially elliptically polarizing substrates. In one non-limiting embodiment, the security elements are at least partially linearly polarizing security elements.

Furthermore, the security element according to the aforementioned non-limiting embodiment can further comprise one or more other coatings or sheets to form a multi-layer reflective security element with viewing angle dependent characteristics as described in U.S. Pat. No. 6,641,874 at column 1, line 6 to column 13, line 28, which is hereby incorporated herein by reference.

In a one non-limiting embodiment, the photosensitive article of the present invention comprises: a) a substrate; and b) an at least partially cured coating composition connected to a portion of at least one surface of the substrate, said coating composition comprising an effective amount of at least partially crosslinked photosensitive polymeric microparticles wherein at least one of the surface and/or interior domains of the microparticles is adapted to be photosensitive. In one non-limiting embodiment, the substrate is chosen from glass, masonry, textiles, ceramics, e.g., sol gel materials, metals, wood, paper or polymeric organic materials. In a further non-limiting embodiment, the substrate is glass, ceramic or a polymeric material and is chosen from un-tinted substrates, tinted substrates, photochromic substrates, tinted-photochromic substrates, at least partially linearly polarizing substrates, at least partially circularly polarizing substrates, at least partially elliptically polarizing substrates or at least partially reflective substrates.

Non-limiting examples of polymeric organic materials that can be used as substrates in conjunction with various non-limiting embodiments disclosed herein include polymeric materials, for example, homopolymers and copolymers, prepared from the monomers and mixtures of monomers disclosed in U.S. Pat. No. 6,733,887 at column 9, line 55 to column 17, line 7 and in U.S. Pat. No. 5,658,501 from column 15, line 28 to column 16, line 17, the disclosures of which U.S. patents are incorporated herein by reference.

As used herein the term "at least partially linearly polarizing" with reference to coatings or substrates refers to coatings or substrates that are adapted to linearly polarize radiation (e.g., confine from some to all of the vibrations of the electric field vector of light waves to one direction). As used herein the term "at least partially circularly polarizing" with reference to coatings or substrates refers to coatings or substrates that are adapted to circularly polarize from some to all of the radiation. As used herein the term "at least partially elliptically polarizing" with reference to coatings or substrates refers to coatings or substrates that are adapted to elliptically polarize from some to all of the radiation. As used herein, the term "photochromic" when used in reference to coatings or substrates, refers to coating or substrate having an absorption spectrum for visible radiation that varies in response to at least actinic radiation. Further, as used herein with reference to substrates, the term "tinted-photochromic" means substrates containing a coloring agent as well as a photochromic material, and having an absorption spectrum for visible, ultraviolet and/or infrared radiation that varies in response to at least actinic radiation. Thus for example, in one non-limiting embodiment, the tinted-photochromic substrate can have a first color characteristic of the coloring agent and a second color characteristic of the combination of the coloring agent and the photochromic material when exposed to actinic radiation.

In one non-limiting embodiment, the coating composition can be in liquid or solid form and can be applied as an at least partial coating of an at least partially cured coating composition. An at least partial coating covers from some to all of the coated surface and from some to all of the curable components of the coating composition are cured, e.g., reacted or polymerized.

In further non-limiting embodiment, the coating composition is an adhesive, a paint, or an ink. In a still further non-limiting embodiment, the coating composition is an adhesive. Adhesives such as thermoplastic or thermosetting adhesives, as well as primer compositions of coupling agents described herein can be used in the present invention. Paints, which are pigmented liquids or pastes used for the decoration, protection and/or the identification of a substrate, and inks which are pigmented liquids or pastes used for writing and printing on substrates can be used in the present invention.

In a still further non-limiting embodiment, the photosensitive article that has an adhesive as the coating composition further comprises a first at least partially cured polymeric sheet connected to at least one surface of the coating composition. As used herein the term "connected to" means in direct contact with an object or indirect contact with an object through one or more other structures or materials, at least one of which is in direct contact with the object. In yet a still further non-limiting embodiment, the photosensitive article further comprises a second at least partially cured polymeric sheet said second polymeric sheet being adjacent to the substrate and connected to the first polymeric sheet by the adhesive coating composition. In another non-limiting embodiment, the photosensitive article is one in which at least one of the first and second polymeric sheets is photosensitive.

In a further non-limiting embodiment of the present invention, the photosensitive article comprises a substrate and an at least partially cured coating composition connected to at least a portion of at least one surface of the substrate wherein the coating composition comprises an at least partially ordered anisotropic material and the at least partially crosslinked photosensitive polymeric microparticles are at least partially aligned with the anisotropic material.

Non-limiting methods of applying coating compositions comprising the photosensitive polymeric microparticles of the present invention include those methods known in the art for applying coatings, such as spin coating, spray coating, spray and spin coating, curtain coating, flow coating, dip coating, injection molding, casting, roll coating, wire coating, and overmolding. According to one non-limiting embodiment, an at least partial coating comprising the photosensitive polymeric microparticles is applied to a mold and the substrate is formed on top of the coating or a preformed substrate is placed on top of the coating, e.g., by overmolding, and the coating is at least partially cured. In this embodiment, the coating can be applied as a liquid or powder coating comprising the photosensitive polymeric microparticles. Photochromic articles including a polymeric sheet described hereinafter can also be prepared using the overmolding process.

Another non-limiting embodiment of the present invention is a photochromic coated article comprising: a) a substrate; and b) an at least partially cured photochromic coating connected to at least a portion of at least one surface of the substrate, the photochromic coating comprising a film-forming polymer and an effective amount of at least partially crosslinked photochromic polymeric microparticles of the present invention. In the various non-limiting embodiments of the present invention, the exact nature of the film-forming polymer is not critical. Any film-forming polymeric materials that is compatible with the photochromic polymeric microparticles can be used.

In one non-limiting embodiment, the film-forming polymer is chosen from thermosetting polymeric materials, thermoplastic polymeric materials or a mixture of such polymeric materials. In another non-limiting embodiment, the film-forming polymer is a thermosetting polymeric material that is chosen from polyurethanes, poly(urea-urethanes), aminoplast resins, polysiloxanes, polyanhydrides, polyacrylamides, epoxy resins or poly(meth)acrylates, e.g., polymethacrylates, polyacrylates or mixtures thereof.

Non-limiting examples of coating compositions of film forming polymers that include photochromic materials include photochromic polyurethane coatings, such as those described in U.S. Pat. No. 6,187,444 at column 3, line 4 to column 12, line 15; photochromic aminoplast resin coatings, such as those described in U.S. Pat. No. 6,432,544 at column 2, line 52 to column 14, line 5 and U.S. Pat. No. 6,506,488 at column 2, line 43 to column 12, line 23; photochromic polysiloxane coatings, such as those described in U.S. Pat. No. 4,556,605 at column 2, line 15 to column 7, line 27; photochromic poly(meth)acrylate coatings, such as those described in U.S. Pat. No. 6,602,603 at column 3, line 15 to column 7, line 50, U.S. Pat. No. 6,150,430 at column 8, lines 15-38, and U.S. Pat. No. 6,025,026 at column 8, line 66 to column 10, line 32; polyanhydride photochromic coatings, such as those described in U.S. Pat. No. 6,436,525 at column 2, line 52 to column 11, line 60; photochromic polyacrylamide coatings such as those described in U.S. Pat. No. 6,060,001 at column 2, line 6 to column 5, line 40; photochromic epoxy resin coatings, such as those described in U.S. Pat. No. 6,268,055 at column 2, line 63 to column 15, line 12; and photochromic poly(urea-urethane) coatings, such as those described in U.S. Pat. No. 6,531,076 at column 2, line 60 to column 10, line 49. The disclosures in the aforementioned U.S. patents that relate to the film-forming polymers are hereby incorporated herein by reference.

In a series of further non-limiting embodiments of the photochromic coated article of the present invention, the at least partially cured photochromic coating is connected to at least a portion of at least one surface of the substrate; the coated article further comprises an at least partial coating of a primer coating connected to at least a portion of at least one surface of the substrate; the coated article further comprises an at least partially abrasion resistant coating connected to at least a portion of at least one surface of the substrate; the coated article further comprises an at least partially antireflective coating connected to at least a portion of at least one surface of the substrate; the coated article further comprises an at least partial coating of a transitional coating interposed between the photochromic coating and the abrasion resistant coating; and the coated article further comprises an at least partially polarizing polymeric film or coating connected to at least a portion of at least one surface of the substrate.

In another series of non-limiting embodiments, the aforementioned coatings can be connected to at least a portion of the same surface of a substrate in the following order from the surface: primer; photochromic; transitional; abrasion resistant; polarizing film or coating; antireflective; and abrasion resistant; or primer; photochromic; transitional; abrasion resistant; and antireflective; or photochromic; transitional; and polarizing; or primer; photochromic; and polarizing; or primer; photochromic; and antireflective. Numerous different combinations of the aforementioned coatings are possible as known by those skilled in the art. All of the aforementioned coating can be applied to one or more surfaces of a substrate, e.g., both surfaces of an optical substrate. In a further non-limiting embodiment, the photochromic coating is typically applied to one surface. The substrate can be any type of materials described herein as a substrate. In one non-limiting embodiment, the substrate is an optical element. In another non-limiting embodiment, the optical element is an ophthalmic element.

Non-limiting examples of primer coatings that can be used in conjunction with various non-limiting embodiments disclosed herein include coatings comprising coupling agents, at least partial hydrolysates of coupling agents, and mixtures thereof. As used herein "coupling agent" means a material having at least one group capable of reacting, binding and/or associating with a group on at least one surface. In one non-limiting embodiment, a coupling agent can serve as a molecular bridge at the interface of at least two surfaces that can be similar or dissimilar surfaces. Coupling agents, in another non-limiting embodiment, can be monomers, pre-polymers and/or polymers. Such materials include, but are not limited to, organo-metallics such as silanes, titanates, zirconates, aluminates, zirconium aluminates, hydrolysates thereof and mixtures thereof. As used herein the phrase "at least partial hydrolysates of coupling agents" means that at least some to all of the hydrolyzable groups on the coupling agent are hydrolyzed. Other non-limiting examples of primer coatings that are suitable for use in conjunction with the various non-limiting embodiments disclosed herein include those primer coatings described U.S. Pat. No. 6,025,026 at column 3, line 3 to column 11, line 40 and U.S. Pat. No. 6,150,430 at column 2, line 39 to column 7, line 58, which disclosures are hereby incorporated herein by reference.

As used herein, the term "transitional coating" means a coating that aids in creating a gradient in properties between two coatings. For example, although not limiting herein, a transitional coating can aid in creating a gradient in hardness between a relatively hard coating and a relatively soft coating. Non-limiting examples of transitional coatings include radiation-cured acrylate-based thin films as described in U.S.

Patent Application Publication 2003/0165686, which coating disclosure is hereby incorporated herein by reference.

Non-limiting examples of at least partially abrasion resistant coatings include abrasion-resistant coatings comprising organosilanes, organosiloxanes, abrasion-resistant coatings based on inorganic materials such as silica, titania and/or zirconia, organic abrasion-resistant coatings of the type that are ultraviolet light curable, oxygen barrier-coatings, UV-shielding coatings, and combinations thereof.

The phrase "an at least partially abrasion resistant coating or sheet" refers to a coating or an at least partial sheet of a protective polymeric material that demonstrates a resistance to abrasion that is greater than a standard reference material, e.g., a polymer made of CR-39® monomer available from PPG Industries, Inc, as tested in a method comparable to ASTM F-735 Standard Test Method for Abrasion Resistance of Transparent Plastics and Coatings Using the Oscillating Sand Method.

The phrase "an at least partially antireflective coating" refers to a coating that at least partially improves the antireflective nature of the substrate to which it is applied by reducing the amount of glare reflected by the surface of the substrate and for transparent substrates by increasing the percent transmittance as compared to an uncoated substrate. Non-limiting examples of antireflective coatings include a monolayer or multilayer of metal oxides, metal fluorides, or other such materials, which can be deposited onto the articles of the present invention through vacuum evaporation, sputtering, or some other method.

Non-limiting examples of at least partially linearly polarizing coatings include, but are not limited to, coatings comprising conventional dichroic compounds such as, but not limited to, those discussed previously.

In one non-limiting embodiment, the article of the present invention is a photochromic composite article comprising: a) a substrate; and b) an at least partially cured photochromic polymeric sheet connected to at least one surface of the substrate, the photochromic polymeric sheet comprising an effective amount of an at least partially crosslinked photochromic polymeric microparticles of the present invention. Photochromic articles of the present invention comprising a substrate and one or more sheets are referred to as photochromic composite articles.

In another non-limiting embodiment, the substrate is the same as described herein before and the photochromic composite article is an optical element. In a further non-limiting embodiment, the optical element is an ophthalmic element. Non-limiting examples of the at least partially cured polymeric sheet comprise thermosetting polymeric materials, thermoplastic polymeric materials or mixtures thereof. In one non-limiting embodiment, the at least partially cured polymeric sheet comprises a thermoplastic polyurethane.

In a further non-limiting embodiment, the photochromic composite articles of the present invention described herein can further comprise an at least partially abrasion resistant protective polymeric sheet connected to at least a portion of at least one surface of the at least partially cured photochromic polymeric sheet. In another non-limiting embodiment, the at least partially abrasion resistant protective polymeric sheet comprises thermosetting polymeric materials, thermoplastic polymeric materials or mixtures thereof. In a further non-limiting embodiment, the at least partially abrasion resistant protective polymeric sheet comprises thermoplastic polycarbonate.

In another non-limiting embodiment, the photochromic composite article of the present invention comprises: a) a substrate; b) an at least partially cured coating of a photochromic adhesive connected to at least a portion of at least one surface of the substrate, said adhesive comprising an adhesive and an effective amount of an at least partially crosslinked photochromic polymeric microparticles of the present invention; and c) a first at least partially cured polymeric sheet connected to the photochromic adhesive coating. In one non-limiting embodiment, the photochromic composite article is an optical element. In a further non-limiting embodiment, the photochromic composite article is an ophthalmic element.

In another non-limiting embodiment, the photochromic composite article further comprises a second at least partially cured polymeric sheet, said second polymeric sheet being adjacent to the substrate and connected to the first polymeric sheet by the photochromic adhesive coating. In a further non-limiting embodiment, at least one of the first and second polymeric sheets is photochromic. In a further non-limiting embodiment, the photochromic composite article is a security element.

Additionally, according to various non-limiting embodiments disclosed herein, the at least partial coating and/or at least partial sheet can further comprise at least one additive that may facilitate one or more of the processing, the properties, or the performance of the at least partial coating and/or sheet. Non-limiting examples of such additives include dyes, alignment promoters, kinetic enhancing additives, photoinitiators, thermal initiators, polymerization inhibitors, solvents, light stabilizers (such as, but not limited to, ultraviolet light absorbers and light stabilizers, such as hindered amine light stabilizers (HALS)), heat stabilizers, mold release agents, rheology control agents, leveling agents (such as, but not limited to, surfactants), free radical scavengers, crosslinking agents and adhesion promoters (such as hexanediol diacrylate and coupling agents).

Non-limiting examples of dyes and pigments that can be present in the at least partial coating and/or sheet according to various non-limiting embodiments disclosed herein include organic and inorganic dyes and pigments that are capable of imparting a desired color or other optical property to the at least partial coating and/or sheet.

As used herein, the term "alignment promoter" means an additive that can facilitate at least one of the rate and uniformity of the alignment of a material to which it is added. Non-limiting examples of alignment promoters that can be present in the at least partial coatings and/or sheets according to various non-limiting embodiments disclosed herein include those described in U.S. Pat. No. 6,338,808 at column 1, line 48 to column 9, line 40 and U.S. Patent Publication No. 2002/0039627 at paragraphs [0010] to [0119], which disclosures of alignment promoters are hereby incorporated herein by reference.

Non-limiting examples of kinetic enhancing additives that can be present in the at least partial coating and/or sheets according to various non-limiting embodiments disclosed herein include epoxy-containing compounds, organic polyols, and/or plasticizers. More specific examples of such kinetic enhancing additives are disclosed in U.S. Pat. No. 6,433,043 at column 2, line 57 to column 8, line 37 and U.S. Pat. No. 6,713,536 at column 2, line 62 to column 10, line 6, which disclosures of kinetic enhancing additives are hereby incorporated herein by reference.

The present invention is more particularly described in the following examples, which are intended as illustrative only, since numerous modifications and variations therein will be apparent to those skilled in the art.

Examples A through J represent materials that were combined and reacted with other ingredients in Examples K through S to produce aqueous dispersions of photochromic microparticles. Examples 1 through 22 represent different coating compositions that incorporate the aqueous dispersions of photochromic microparticles of Examples K through S. Example 23 describes the preparation and testing of lenses coated with Examples 1 through 22. The lenses were tested for Fischer microhardness, optical density and fade half-lives. The test results are listed in Tables 12 and 13.

EXAMPLE A

Hydrophilic Urethane Prepolymer

The following materials were added in the order described to a fourneck round bottom flask equipped with an electronic temperature probe, mechanical stirrer, condenser, and a heating mantle.

| Material | Weight in grams |
|---|---|
| Charge A | |
| N-methyl pyrrolidinone (NMP) | 138.9 |
| dimethylolpropionic acid (DMPA) | 134.1 |
| triphenyl phospite | 1.1 |
| dibutyltin dilaurate | 1.1 |
| butylated hydroxytoluene | 1.1 |
| Charge B | |
| 2-(dicaprolactone)ethyl acrylate | 344.4 |
| Charge C | |
| methylene bis(4-cyclohexylisocyanate) | 524.0 |
| Charge D | |
| diethanolamine | 105.1 |
| propylene glycol monobutyl ether | 138.9 |

Charge A was stirred in the flask at a temperature of 100° C. until all solids were dissolved. Charge B was added and the mixture was reheated to 80° C. Charge C was added over a 15 minute period and the resulting mixture was held at 80° C. for 3 hours. Charge D was added and the mixture was cooled to room temperature. The final product was an extremely viscous clear yellow solution with an acid value of 38.0 and a percent solids of 81.4%. The acid value was measured by potentiometric titration with KOH. The percent solids was determined by adding a known amount of the material to an aluminum pan, adding additional water to dilute the material and more evenly distribute it over the pan. The pan was placed in an oven at 110° C. for 1 hour. The pan was then re-weighed and the percent solids was determined from the remaining mass (minus the pan) divided by the initial mass (minus the pan).

EXAMPLE B

Photochromic Hydrophobic Urethane Prepolymer

The following materials were added in the order described to a fourneck round bottom flask equipped with an electronic temperature probe, mechanical stirrer, condenser, and a heating mantle.

| Material | Weight in grams |
|---|---|
| Charge A | |
| N-methyl pyrrolidinone | 72.1 |
| Photochromic A[1] | 67.3 |
| 2-(dicaprolactone)ethyl acrylate | 103.4 |
| dibutyltin dilaurate | 0.3 |
| butylated hydroxytoluene | 0.3 |
| Charge B | |
| 2-heptyl-3,4-bis(9-isocyanatononyl)-1-pentyl-cyclohexane[2] | 117.4 |

[1]Photochromic A is 3,3-di(4-methoxyphenyl)-6,11,13-trimethyl-13-(2-(2-(2-hydroxyethoxy)ethoxy)ethoxy)-3H,13H-indeno[2,1-f]naphtho[1,2-b]pyran.
[2]Diisocyanate available from Cognis Corporation.

Charge A was stirred in the flask and heated to a temperature of 90° C. Charge B was added over a 17 minute period and the mixture was held at 90° C. for 90 minutes and then cooled to room temperature. The final product was a dark purple liquid with a Brookfield viscosity of 1390 cps (spindle # 3, 50 rpm, 25° C.).

EXAMPLE C

Hydrophilic Urethane Prepolymer

The following materials were added in the order described to a fourneck round bottom flask equipped with an electronic temperature probe, mechanical stirrer, condenser, and a heating mantle.

| Material | Weight in grams |
|---|---|
| Charge A | |
| N-methyl pyrrolidinone | 313.3 |
| Dimethylolpropionic acid (DMPA) | 241.5 |
| hydroxyethyl methacrylate (HEMA) | 234.3 |
| triphenyl phospite | 2.3 |
| dibutyltin dilaurate | 2.3 |
| butylated hydroxytoluene | 2.3 |
| Charge B | |
| poly(butylene oxide) having number average molecular weight of 1000 | 1200.0 |
| Charge C | |
| isophorone diisocyanate | 666.9 |
| Charge D | |
| butyl acrylate | 153.0 |
| Charge E | |
| butyl acrylate | 1100.0 |

Charge A was stirred in the flask at a temperature of 100° C. until all solids were dissolved. Charge B was added and the mixture was reheated to 90° C. Charge C was added over a 90 minute period. Charge D was added and the resulting mixture was held at 90° C. for 2 hours. Charge E was added and the mixture was cooled to room temperature. The final product was a clear solution with an acid value of 25.8, percent solids of 58.5%, and a Gardner-Holdt viscosity (ASTM D1545-89) of W+.

EXAMPLES D-I

Photochromic Hydrophobic Urethane Prepolymers

The materials listed in gram quantities for each of Examples D to I in Table 1 were added in the order described to a fourneck round bottom flask equipped with an electronic temperature probe, magnetic stirrer, condenser, and a heating mantle.

Charge A was stirred in the flask and heated to a temperature of 90° C. Charge B was added over a period up to 10 minutes and the mixture was held at 90° C. for 1 hour except for Example D which was held for 2 hours. After changing to an air atmosphere, Charge C was added and the mixture was held at 90° C. for 34-35 minutes for Examples D and E, 23 minutes for Examples F and 1, 20 minutes for Example G and 32 minutes for Example H, and then cooled to room temperature. The final product was a dark liquid having the percent solids listed in Table 2.

TABLE 1

Examples D–I

| Material | D | E | F | G | H | I |
|---|---|---|---|---|---|---|
| Charge A | | | | | | |
| N-methyl pyrrolidionone | 12.1 | | | | | |
| toluene | | 18.65 | 20.06 | 18.26 | 18.33 | 18.73 |
| photochromic A[1] | | | | | 3.03 | 3.03 |
| photochromic B[3] | 18.0 | | | | | |
| photochromic C[4] | | 3.01 | | | | |
| photochromic D[5] | | | 0.02 | | | |
| photochromic E[6] | | | | 2.98 | | |
| 2-(dicaprolactone) ethyl acrylate | 24.1 | | | | | |
| dibutyltin dilaurate | 0.08 | 0.01 | 0.02 | 0.02 | 0.01 | 0.01 |
| butylated hydroxytoluene | 0.08 | | | 0.02 | 0.01 | 0.01 |
| Charge B | | | | | | |
| 2-heptyl-3,4-bis(9-isocyanatononyl)-1-pentyl-cyclohexane[2] | 34.2 | 6.06 | 7.40 | 6.6 | 6.6 | |
| isocyanurate of hexamethylene diisocyanate | | | | | | 2.27 |
| Charge C | | | | | | |
| 2-(dicaprolactone)ethyl acrylate | 7.1 | 6.66 | 8.13 | 7.25 | 7.26 | 4.01 |
| butylated hydroxytoluene | | 0.01 | | | | |

TABLE 2

Percent Solids of Examples D–I

| | D | E | F | G | H | I |
|---|---|---|---|---|---|---|
| Percent solids of resulting product | 32.7 | 58.6 | 50.4 | 57.2 | 53.4 | 37.7 |

(3) Photochromic B is 3-phenyl-3-(4-morpholinophenyl)-6,7-dimethoxy-13-butyl-13-(2-(2-(2-hydroxyethoxy)ethoxy)ethoxy)-3H,13H-indeno[2,1-f]naphtho[1,2-b]pyran.
(4) Photochromic C is 3,3-di(4-methoxyphenyl)-6-methoxy-7-morpholino-13-ethyl-13-(2-(2-hydroxyethoxy)ethoxy)-3H,13H-indeno[2,1-f]naphtho[1,2-b]pyran.
(5) Photochromic D is 3-(4-(2-hydroxyethoxy)phenyl)-3-(4-morpholinophenyl)-13,13-dimethyl-3H,13H-indeno[2,1-f]naphtho[1,2-b]pyran.
(6) Photochromic E is 3-(4-methoxyphenyl)-3-(4-fluorophenyl)-6,7-dimethoxy-13-ethyl-13-(2-(2-hydroxyethoxy)ethoxy)-3H,13H-indeno[2,1-f]naphtho[1,2-b]pyran.

EXAMPLE J

Hydrophobic Urethane Prepolymer

The following materials were added in the order described to a four-neck round bottom flask equipped with an electronic temperature probe, overhead stirrer, condenser, and a heating mantle.

| Material | Weight in grams |
|---|---|
| Charge A | |
| N-methyl pyrrolidinone | 649.3 |
| butylated hydroxytoluene | 3.1 |
| dibutyltin dilaurate | 3.1 |
| 2-(dicaprolactone)ethyl acrylate | 1770.9 |
| Charge B | |
| 2-heptyl-3,4-bis(9-isocyanatononyl)-1-pentyl-cyclohexane[2] | 1408.8 |

Charge A was stirred in the flask under an air atmosphere and heated to a temperature of 90° C. Charge B was added over 25 minutes and the mixture was held at 90° C. for 50 minutes. The final product was a slightly yellow liquid with a percent solids of 81.4% and a Gardner-Holdt viscosity of R+.

EXAMPLE K

Aqueous Dispersion of Photochromic Microparticles Formed From Examples A and B

The following materials were added in the order described as follows.

| Material | Weight in grams |
|---|---|
| Charge A | |
| water | 282.0 |
| dimethylethanolamine | 5.76 |
| propylene glycol monobutyl ether | 15.84 |
| IGEPAL ® CO-897[7] surfactant | 3.57 |
| EXAMPLE A | 90.0 |
| Charge B | |
| 2-(dicaprolactone)ethyl acrylate | 9.6 |
| EXAMPLE B | 49.7 |
| dodecylbenzenesulfonic acid (70% in isopropanol) | 2.33 |
| dimethylethanolamine | 0.65 |
| Charge C | |
| water | 2.0 |
| ferrous ammonium sulfate | 0.01 |
| t-butyl hydroperoxide | 0.16 |
| Charge D | |
| water | 6.0 |
| sodium metabisulfite | 0.2 |
| Charge E | |
| dimethylethanolamine | 0.24 |
| water | 0.48 |

[7] A non-ionic surfactant available from Rhodia.

A pre-emulsion was prepared by stirring Charge A in a glass beaker. Of the pre-emulsion, 132.37 g was recycled for 15 minutes through a Microfluidizer® M110T at 8000 psi and 28° C. while Charge B was added in order. The Microfluidizer® M110T is available from the Microfluidics™ division of MFIC Corporation, Newton, Mass. The resulting microemulsion was transferred to a fourneck round bottom flask equipped with an overhead stirrer, condenser, electronic temperature probe, and a nitrogen inlet. Charge C was added rapidly as a mixture and then Charge D was added as a mixture over a period of 30 minutes. The temperature rose from 30° C. to 33° C. as Charge D was added. Finally, Charge E was added to produce a milky purple dispersion with a pH of 8.22.

EXAMPLE L

Aqueous Dispersion of Microparticles Formed From Example C

The following materials were added in the order described as follows.

| Material | Weight in grams |
|---|---|
| Charge A | |
| EXAMPLE C | 133.3 |
| IGEPAL ® CO-897[7] surfactant | 2.88 |
| Dimethylethanolamine | 5.6 |
| dodecylbenzenesulfonic acid (70% in isopropanol) | 5.76 |
| butyl acrylate | 37.3 |
| propylene glycol monobutyl ether | 20.0 |
| Water | 232.0 |
| Charge B | |
| Water | 20.0 |
| Charge C | |
| Water | 6.0 |
| ferrous ammonium sulfate | 0.02 |
| sodium metabisulfite | 0.5 |
| Charge D | |
| water | 12.0 |
| t-butyl hydroperoxide | 0.4 |
| Charge E | |
| Dimethylethanolamine | 1.2 |
| Water | 2.4 |
| Charge F | |
| CYMEL ® 327[8] resin | 50.0 |

[8]Reported to be a partially methylated melamine/formaldehyde resin sold as a 90 weight percent dispersion in isobutanol available from Cytec, Inc.

A pre-emulsion was prepared by stirring Charge A in a stainless steel beaker. The pre-emulsion was passed once through a Microfluidizer M110T at 8000 psi. The resulting microemulsion was transferred to a fourneck round bottom flask equipped with an overhead stirrer, condenser, electronic temperature probe, and a nitrogen inlet. Charge B was used to rinse the beaker and Microfluidizer M110T and added to the flask. Charge C was added rapidly as a mixture and then Charge D was added as a mixture over a period of 30 minutes. The temperature rose from 30° C. to 54° C. as Charge D was added. Charge E was added as a mixture. Charge F was added to produce a milky white dispersion with a pH of 8.11, a Brookfield viscosity of 39.7 centipoise (spindle #1, 50 rpm, 25° C.) and a percent solids of 36.9%.

EXAMPLE M

Aqueous Dispersion of Photochromic Microparticles Formed From Examples A and D

The following materials were added in the order described as follows.

| Material | Weight in grams |
|---|---|
| Charge A | |
| water | 291.3 |
| dimethylethanolamine | 5.2 |
| propylene glycol monobutyl ether | 14.3 |
| IGEPAL ® CO-897[7] surfactant | 3.1 |
| EXAMPLE A | 81.4 |
| Charge B | |
| 2-(dicaprolactone)ethyl acrylate | 7.0 |
| EXAMPLE D | 47.0 |
| dodecylbenzenesulfonic acid (70% in isopropanol) | 2.07 |
| dimethylethanolamine | 0.55 |
| Charge C | |
| water | 2.1 |
| ferrous ammonium sulfate | 0.01 |
| t-butyl hydroperoxide | 0.14 |
| Charge D | |
| water | 6.2 |
| sodium metabisulfite | 0.19 |

A pre-emulsion was prepared by stirring Charge A in a glass beaker. 131.8 grams of the pre-emulsion was recycled for 15 minutes through a Microfluidizer M110T at 8000 psi and 28° C. while Charge B was added in order. The resulting microemulsion was transferred to a fourneck round bottom flask equipped with an overhead stirrer, condenser, electronic temperature probe, and a nitrogen inlet. Charge C was added rapidly as a mixture and then Charge D was added as a mixture over a period of 30 minutes. The temperature rose from 30° C. to 33° C. as Charge D was added. The final product was a milky gray dispersion with a pH of 8.21 and percent solids of 33.1%.

EXAMPLES N-R

Aqueous Dispersions of Photochromic Microparticles Formed From Example A with Examples E, F, G, H, or I and J Table 3 lists the amounts of materials in grams used in the preparation of Examples N-R which were used in the order described as follows. A pre-emulsion was prepared by stirring Charge A in a glass beaker. Of the resulting pre-emulsion: 53.7 grams for Example N, 73.59 grams for Example O; 60.31 grams for Example P; 57.31 grams for Example Q and 66.14 grams for Example R were each recycled for 15 minutes through a Microfluidizer M110T at 8000 psi and 70° C. while Charge B was added in order. The resulting microemulsion was transferred to a fourneck round bottom flask equipped with a magnetic stirrer, condenser, electronic temperature probe, and a nitrogen inlet. Charge C was used to rinse the Microfluidizer and was then added to the flask. The temperature of the microemulsion was adjusted to 23° C. Charge D was added rapidly as a mixture and then Charge E was added as a mixture over a period of 30 minutes. The temperature rose to 24-26° C. as Charge E was added. The resulting microdispersion was distilled under reduced pressure until the amount listed in Table 4 remained for each Example. The final product was a dark liquid with the pH and percent solids also listed in Table 4.

TABLE 3

Examples N–R

| Materials | N | O | P | Q | R |
|---|---|---|---|---|---|
| Material | | | Charge A | | |
| Example J | | | | | 17.40 |
| 2-(dicaprolactone)ethyl acrylate | 2.2 | 3.8 | 2.8 | 2.6 | 2.9 |
| Example A | 19.6 | 23.5 | 20.9 | 20.3 | 20.3 |
| dodecylbenzenesulfonic acid (70% in isopropanol) | 1.5 | 1.8 | 1.6 | 1.5 | 1.5 |
| dimethylethanolamine) | 1.3 | 1.6 | 1.4 | 1.4 | 1.4 |
| Water | 82.8 | 116.5 | 94.0 | 88.8 | 88.8 |
| Material | | | Charge B | | |
| Example E | 24.75 | | | | |
| Example F | | 34.4 | | | |
| Example G | | | 26.65 | | |
| Example H | | | | 27.76 | |
| Example I | | | | | 20.89 |
| toluene | 2.09 | 1.25 | 2.22 | | |
| Material | | | Charge C | | |
| water | 30.0 | 30.0 | 30.0 | 30.0 | 30.0 |
| Material | | | Charge D | | |
| water | 2.0 | 2.0 | 2.0 | 2.0 | 2.0 |
| ferrous ammonium sulfate solution (1% in water) | 0.1 | 0.13 | 0.11 | 0.11 | 0.11 |
| t-butyl hydroperoxide (70% in water) | 0.05 | 0.06 | 0.06 | 0.05 | 0.05 |
| Material | | | Charge E | | |
| water | 10.0 | 10.0 | 10.0 | 10.0 | 10.0 |
| sodium metabisulfite | 0.07 | 0.08 | 0.07 | 0.07 | 0.07 |

TABLE 4

Characteristics of Examples N–R

| | N | O | P | Q | R |
|---|---|---|---|---|---|
| Amount of each Example in grams remaining after distillation | 67.5 | 76.3 | 65.2 | 57.5 | 55.8 |
| pH | 6.5 | 6.48 | 6.75 | 6.52 | 6.63 |
| percent solids | 34 | 35.7 | 35.9 | 39.9 | 41.6 |

EXAMPLE S

An Aqueous Dispersion of Photochromic Microparticles Formed From Examples A and B The following materials were added in the order described as follows.

| Material | Weight in grams |
|---|---|
| Charge A | |
| Water | 562.4 |
| dimethylethanolamine | 1.7 |
| propylene glycol monobutyl ether | 22.44 |
| EXAMPLE A | 127.5 |
| 2-(dicaprolactone)ethyl acrylate | 40.66 |
| Charge B | |
| EXAMPLE B | 210.8 |
| dodecylbenzenesulfonic acid (70% in isopropanol) | 9.71 |
| dimethylethanolamine | 6.97 |
| Charge C | |
| Water | 30.0 |
| Charge D | |
| Water | 10.0 |
| ferrous ammonium sulfate | 0.01 |
| t-butyl hydroperoxide | 0.68 |
| Charge E | |
| Water | 30.0 |
| sodium metabisulfite | 0.85 |

A pre-emulsion was prepared by stirring Charge A in a fourneck round bottom flask equipped with an overhead stirrer, condenser, electronic temperature probe, and an air inlet. The pre-emulsion was heated to 60° C. and recycled for 15 minutes through a Microfluidizer® M110T at 8000 psi without cooling while Charge B was added in order. Cooling water was applied to the Microfluidizer® M110T to lower the temperature of the resulting microemulsion to 25° C. The microemulsion was transferred to a fourneck round bottom flask equipped with an overhead stirrer, condenser, electronic temperature probe, and a nitrogen inlet. Charge C was used to rinse the Microfluidizer® and was then added to the flask. Charge D was added rapidly as a mixture and then Charge E was added as a mixture over a period of 30 minutes. The temperature rose from 25° C. to 30° C. as Charge E was added. The resulting milky purple dispersion had a pH of 6.58, a Brookfield viscosity of 48.3 centipoise (spindle #1, 50 rpm, 25° C.), and a percent solids of 30.8%.

EXAMPLES 1-8

Coating Compositions of Aqueous Dispersions of Photochromic Microparticles of Example K Using Melamine Resins As Crosslinkers Part A Enough water was added to the material of Example K to result in a percent solids measurement of 23.2%. The resulting solution was stirred for about an 1 hour.

Part B

The materials listed in gram quantities for each of Example 1-8 in Table 5, were added in the order described as follows:

While Charge A was stirring with a magnetic stir bar in a beaker on a stirring plate, Charge B was added to it using an adjustable pipette. The resulting mixture was stirred for 2-5 minutes. Charge C was added in the same manner as Charge B. Charge D was added and the resulting mixture was occasionally shaken from 2-10 times to make sure it was mixed from top to bottom and stirred for 20-45 minutes. After the stirring was stopped the resulting solution remained quiescent for 30-60 minutes to drive off bubbles that had formed.

TABLE 5

Examples 1–8

| Materials | 1 | 2 | 3 | 4 | 5 | 6 | 7 | 8 |
|---|---|---|---|---|---|---|---|---|
| | | | | Charge A | | | | |
| Product of Part A | 10.0 | 10.1 | 10.0 | 10.1 | 10.0 | 10.1 | 10.0 | 10.1 |

TABLE 5-continued

| | Examples 1–8 | | | | | | | |
|---|---|---|---|---|---|---|---|---|
| Materials | 1 | 2 | 3 | 4 | 5 | 6 | 7 | 8 |
| | Charge B | | | | | | | |
| A-187[9] | 0.31 | 0.31 | 0.30 | 0.33 | 0.31 | 0.3 | 0.31 | 0.33 |
| | Charge C | | | | | | | |
| First Stabilizer[10] | 1.0 | | | | 1.0 | | | |
| CYMEL ® 327[8] resin | | 0.71 | 2.5 | 6.55 | | | | |
| CYMEL ® 385[11] resin | | | | | | 0.72 | 2.73 | 7.24 |
| | Charge D | | | | | | | |
| CYMEL ® 327[8] resin | 0.71 | | | | | | | |
| CYMEL ® 385[11] resin | | | | | 0.81 | | | |

[9]Reported to be gamma-glycidoxypropyltrimethoxysilane and is available from Osi Specialty Chemicals.
[10]5 percent by weight TINUVIN-144, reported to have CAS# 63843-89-0 and is available from Ciba Specialty Chemicals, in NMP. The First Stabilizer solution was prepared by stirring until TINUVIN-144 was dissolved.
[11]Reported to be a methoxymethyl methylol melamine resin available from Cytec, Inc.

EXAMPLES 9-13

Coating Compositions of Aqueous Dispersions of Photochromic Microparticles of Example L or M Using Melamine Resin as a Crosslinker in all Except Example 9

The procedure of Part B of Example 1 was followed except that the following materials were used in the amounts indicated in grams in Table 6.

TABLE 6

| | Examples 9–13 | | | | |
|---|---|---|---|---|---|
| Materials | 9 | 10 | 11 | 12 | 13 |
| | Charge A | | | | |
| Example L | 5.1 | 5.1 | 5.1 | 5.1 | |
| Example M | | | | | 15.0 |
| | Charge B | | | | |
| A-187[9] | 0.32 | 0.33 | 0.31 | 0.3 | 0.44 |
| | Charge C | | | | |
| Photochromic/Stabilizer[12] | 5.1 | 5.0 | 5.0 | 5.0 | |
| First Stabilizer[10] | | | | | 1.5 |
| | Charge D | | | | |
| CYMEL ® 327[8] resin | | 2.1 | 4.1 | 15.1 | 1.47 |

[12]The Photochromic/Stabilizer was prepared by adding Photochromic F which is 3,3-di(4-methoxyphenyl)-6,11,13-trimethyl-13-hydroxy-3H,13H-indeno[2,1-f]naphtho[1,2-b]pyran, 1.75 g, and TINUVIN-144, 0.87 g, which was described as a material in the First Stabilizer[10] in NMP, 50.0 g. The materials were dissolved with stirring and warming the solution to less than 45° C. to produce a solution having 3.3 weight percent of Photochromic F and 1.7 weight percent TINUVIN-144 in NMP.

EXAMPLES 14-16

Coating Compositions of Aqueous Dispersions of Photochromic Microparticles of Example K Using as a Crosslinker: Polycarbodiimide; Polyaziridine; or Isocyanato-Functional Organosilane Part A The procedure of Example 1 was followed except that enough water was added to the material of Example K to result in a present solids measurement of 31.4 percent solids.

Part B

The procedure of Example 1 was followed except that the following materials were used in the amounts indicated in grams in Table 7.

TABLE 7

| | Examples 14–16 | | |
|---|---|---|---|
| Materials | 14 | 15 | 16 |
| | Charge A | | |
| Product of Part A | 33.6 | 33.6 | 30.0 |
| | Charge B | | |
| CARBODILITE V-02-L2[13] | 4.6 | | |
| CX-100 polyaziridine[15] | | 1.85 | |
| Tris(trimethoxysilylpropyl) Isocyanurate | | | 3.31 |
| | Charge C | | |
| Stabilizer/Adhesion Promoter[14] | 5.1 | 5.1 | |

[13]A multifunctional polycarbodiimide provided as 40% solids in water and was manufactured by Nisshinbo Industries, Inc. of Japan.
[14]The Stabilizer/Adhesion Promoter was prepared by dissolving 3.5 weight percent of TINUVIN-144 and 19.9 weight percent of A-187 adhesion promoter in NMP
[15]A polyaziridine provided as 100% solids from NeoResins, Inc.

EXAMPLE 17

A Coating Composition of Aqueous Dispersions of Photochromic Microparticles of Examples N, O and P Using Melamine Resin as a Crosslinker and Including a Urethane Diol The procedure of Part B of EXAMPLE 1 was followed except that the following materials were used in the amounts indicated in grams in Table 8.

TABLE 8

| | Example 17 | | |
|---|---|---|---|
| Materials | 17 Part 1 | 17 Part 2 | 17 Part 3 |
| | Charge A | | |
| Example N | 15.03 | | |
| Example O | | 15.04 | |
| Example P | | | 15.06 |
| | Charge B | | |
| Stabilizer/Adhesion Promoter[14] | 2.56 | 2.68 | 2.68 |
| | Charge C | | |
| CYMEL ® 328[16] resin | 7.04 | 6.30 | 6.45 |
| | Charge D | | |
| K-FlexUD-350w[17]diol | 2.01 | 2.00 | 1.88 |

[16]Reported to be a high imino melamine resin available as 85% active in water from Cytec, Inc.
[17]Reported to be a urethane diol provided as 88% active in water and is available from King Industries, Inc.

Part 4

The following materials were added in the order described to a beaker and mixed for about 10 minutes to produce Example 17.

| Material | Weight in grams |
| --- | --- |
| Product of Part 2 | 7.75 |
| Product of Part 3 | 4.19 |
| Product of Part 1 | 2.67 |

EXAMPLES 18-19

Coating Compositions of Aqueous Dispersions of Photochromic Microparticles of Examples Q or R Using Melamine Resin as a Crosslinker and Including a Urethane Diol The procedure of Part B of EXAMPLE 1 was followed except that the following materials were used in the amounts indicated in grams in Table 9.

TABLE 9

Examples 18–19

| Materials | 18 | 19 |
| --- | --- | --- |
| Charge A | | |
| Example Q | 10.04 | |
| Example R | | 10.02 |
| Charge C | | |
| CYMEL ® 328[16] resin | 4.68 | 4.91 |
| Charge D | | |
| K-FlexUD-35OW[17] diol | 1.32 | 1.54 |

EXAMPLES 20-22

Coating Compositions of Aqueous Dispersions of Photochrmic Microparticles of Example S Using Commercially Available Solgel Hardcoat Producing Solutions The procedure of Part B of EXAMPLE 1 was followed except that the following materials were used in the amounts indicated in grams in Table 10.

TABLE 10

Examples 20–22

| Materials | 20 | 21 | 22 |
| --- | --- | --- | --- |
| Charge A | | | |
| EXAMPLE S | 10.0 | 10.0 | 15.0 |
| Charge B | | | |
| HiGard ® 1020[18] coating solution | 8.57 | | |
| HiGard ® 1080[19] coating solution | | 10.0 | |
| HiGard ® 1035[20] coating solution | | | 15.0 |

(18, 19 and 20) HiGard® 1020 coating solution, HiGard® 1080 coating solution, and HiGard® 1035 coating solution are each a commercially available solgel hardcoat producing coating solution from PPG Industries, Inc.

EXAMPLE 23

The preparation of the lenses is described in Part A; the coating of the lenses is described in Part B; the Fischer Microhardness Testing of Coated Lenses is described in Part C; and the Photochromic Performance Testing of the Coated Lenses is described in Part D Part A PDQ® coated Gentex® polycarbonate piano lenses having a diameter of 76 millimeters were either used as supplied or were washed with dishwashing detergent and water, rinsed with the deionized water and dried. The lenses of Examples 1 through 13 were used as supplied and treated with oxygen plasma at a flow rate of 100 milliliters (mL) per minute of oxygen at 100 watts of power for one minute. The cleaned lenses of Examples 14 to 22 were treated with a burst of ionized air to remove any dust particles and subjected to corona treatment in a 3DT MultiDyne 1 system by placing each lens about 1 inch (2.54 cm) beneath the corona source, rotating about 200 rpm and treating for about 3 to 4 seconds.

Part B

The lenses prepared in Part A were coated with the solutions of Examples 1-22 via a spin coating process. About 1-2 mL of the solution of each example was dispensed onto the lens and the lens rotated at the speeds and for the times listed in Table 11. The coated lenses of Examples 1-19 were cured in a forced air oven via the following cure cycle: 80° C. for 20 minutes, ramp to 120° C. over 5 minutes, hold at 120° C. for 1 hour and cool to room temperature. The coated lenses of Examples 20-22 were cured in a forced air oven at 60° C. for 20 minutes and then cured at 120° C. for 3 hours.

TABLE 11

Spin Coating Parameters

| Example No. | Spin Speed (rpm) | Spin Time (seconds) |
| --- | --- | --- |
| 1, 2, 5, 6 | 1,100 | 5.0 |
| 3 | 1,100 | 3.7 |
| 4, 7 | 1,100 | 3.0 |
| 8 | 1,100 | 2.3 |
| 9 | 850 | 3.5* |
| 10 | 850 | 3.0* |
| 11 | 850 | 3.3* |
| 12 | 850 | 4.0* |
| 13 | 1,100 | 4.5 |
| 14, 15, 16, 20, 21, 22 | 1,100 | 6.0 |
| 17 | 700 | 5.0* |
| 18 | 1,600 | 2.0 |
| 19 | 1,600 | 3.0 |

*Indicates that some of the material was dispensed before spinning and some was dispensed for up to 1.0 second during the spinning of the lenses.

Part C

The coated lenses prepared in Part B were subjected to microhardness testing using a Fischerscope HCV, Model H-100 available from Fischer Technology, Inc. The microhardness is measured in Newtons per $mm^2$. The measurements were made after the lenses were conditioned at about 48% relative humidity at a temperature of 21-23° C. for at least 12 hours. Each lens was measured from 2 to 5 times and the resulting data was averaged. The hardness measurements were taken as the hardness at a penetration depth of 2 microns after a 100 Newton load for 15 seconds. Results are listed in Table 11.

Part D

The coated lenses prepared in Part B were screened for ultraviolet absorbance on a VARIAN CARY 3 UV-Visible spectrophotometer or comparable instrument. Lenses having comparable UV absorbance at 390 nanometers were tested for photochromic response on an optical bench. Prior to response testing on an optical bench, the coated lenses were conditioned by exposing them to 365 nm ultraviolet light for 10 minutes at a distance of about 14 cm from the source in order to pre-activate the photochromic materials. The UVA irradiance at the sample was measured with a Licor Model Li-1800 spectroradiometer and found to be 22.2 Watts per square meter. The samples were then placed under a halogen lamp (500 W, 120 V) for about 10 minutes at a distance of about 36 cm from the lamp in order to bleach, or inactivate, the photochromic materials in the samples. The illuminance at the sample was measured with the Licor spectroradiometer and found to be 21.9 Klux. The samples were then kept in a dark environment for at least 1 hour in order to cool and continue to fade back to a ground state prior to testing.

The optical bench used to measure photochromic response was fitted with an Oriel Model #66011 300-watt Xenon arc lamp, an Oriel Model 71445 computer controlled shutter, a Schott 3 mm KG-2 band-pass filter, to remove short wavelength radiation, coated fused silica neutral density filter(s) to attenuate light from the xenon lamp, a fused silica condensing lens for beam collimation, and a quartz water cell/sample holder for maintaining sample temperature in which the sample to be tested was inserted. The temperature in the water cell was controlled with a pumped water circulation system in which the water passed through copper coils that were placed in the reservoir of a chiller unit. The water cell used to hold test samples contained fused silica sheets on the front and back facings in order to eliminate spectral change of the activation or monitoring light beams. The filtered water passing through the water cell was maintained at 72° F.±2° for photochromic response testing. An Oriel Photofeedback unit, Model 68850 was used to control the intensity of the xenon arc lamp during activation of the sample.

An Ocean Optics LS-1 tungsten halogen light source was used as the monitoring light source for photochromic response measurement. Light, focused into a fiber optic cable was collimated and passed perpendicularly through the center of the sample, in the water cell. After passing through the sample, the light was refocused into a 2-inch integrating sphere and fed to an Ocean Optics S2000 spectrophotometer by fiber optic cables. Ocean Optics OOIBase 32 software and PPG proprietary software were used to measure response and control the operation of the optical bench.

Irradiance for response testing of the photochromic samples on the optical bench was established at the sample using an International Light Research Radiometer, Model IL-1700 with a detector system comprising a Model SED033 detector, B Filter and diffuser. The output display of the radiometer was corrected (factor values set) against a Licor 1800-02 Optical Calibration Calibrator in order to display values representing Watts per square meter UVA. The irradiance at the sample point for response testing was set at to 6.7 Watts per square meter UVA and having an illuminance of about 18 Klux. The test samples were exposed to the activation light at 31° from normal while being perpendicular to the monitoring light.

Samples were activated in the 72° F. controlled water cell for 15 or 30 minutes until the sample reached a saturated density. At which time, the shutter for the activation beam was closed. The sample continued to be monitored during the fading under room light conditions for a maximum of 30 minutes. The fade half-life (T ½) was determined for each sample while it was fading on the optical bench. The first half-life of fade was the time interval in seconds for the saturated $\Delta OD$ of the activated form of the photochromic material in the coating on the lens to fade to one half the highest $\Delta OD$ measured after fifteen or thirty minutes of activation at 72° F. (22° C.), after removal of the source of activating light, e.g., by closing the shutter. The second half-life of fade was the time interval in seconds for the $\Delta OD$ of the activated form of the photochromic material in the coating on the lens to fade to one fourth the highest $\Delta OD$ measured as described above. The third half-life of fade was the time interval in seconds for the $\Delta OD$ of the activated form of the photochromic material in the coating on the lens to fade to one eight the highest $\Delta OD$ measured, as described above. The various fade half-lives measured for each sample are included in Table 13.

TABLE 12

| Example # | Fischer Microhardness (N/mm$^2$) |
|---|---|
| 1 | 45 |
| 2 | 44 |
| 3 | 84 |
| 4 | 122 |
| 5 | 56 |
| 6 | 53 |
| 7 | 98 |
| 8 | 147 |
| 9 | 21 |
| 10 | 80 |
| 11 | 104 |
| 12 | 130 |
| 13 | 65 |
| 14 | 16 |
| 15 | 23 |
| 16 | 42 |
| 17 | 99 |
| 18 | 99 |
| 19 | 101 |
| 20 | 10 |
| 21 | 33 |
| 22 | 49 |

TABLE 13

| Example # | Absorbance @ 390 nm | Optical Density @ Wavelength tested (nm) | First Half-life of fade (sec) | Second Half-life of fade (sec) | Third Half-life of fade (sec) |
|---|---|---|---|---|---|
| 1 | 1.14 | 0.84 @ 565 | 42 | 95 | 196 |
| 2 | 1.28 | 0.87 @ 565 | 43 | 96 | 204 |
| 3 | 1.52 | 0.92 @ 565 | 48 | 108 | 264 |
| 4 | 1.63 | 0.94 @ 565 | 62 | 173 | 827 |
| 5 | 1.12 | 0.83 @ 565 | 43 | 94 | 186 |
| 6 | 1.22 | 0.84 @ 565 | 42 | 92 | 185 |
| 7 | 1.32 | 0.85 @ 565 | 42 | 90 | 176 |
| 8 | 1.37 | 0.89 @ 565 | 52 | 144 | — |
| 9 | 0.92 | 0.62 @ 565 | 48 | 122 | — |
| 10 | 0.86 | 0.44 @ 565 | 146 | 1168 | — |
| 11 | 0.86 | 0.38 @ 565 | 215 | >1800 | — |
| 12 | 0.84 | 0.78 @ 565 | 422 | >1800 | — |

TABLE 13-continued

| Example # | Absorbance @ 390 nm | Optical Density @ Wavelength tested (nm) | First Half-life of fade (sec) | Second Half-life of fade (sec) | Third Half-life of fade (sec) |
|---|---|---|---|---|---|
| 13 | 1.12 | 0.58 (photopic) | 54 | 129 | — |
| 14 | 1.52 | 0.87 @ 570 | 44 | 96 | — |
| 15 | 1.62 | 0.90 @ 570 | 45 | 97 | — |
| 16 | 1.99 | 0.92 @ 570 | 44 | 95 | — |
| 17 | 1.20 | 0.59 (photopic) | 50 | 109 | 198 |
| 18 | 1.39 | 0.85 @ 565 | 46 | 102 | 204 |
| 19 | 1.30 | 0.88 @ 565 | 70 | 167 | 436 |
| 20 | 1.48 | 0.87 @ 565 | 42 | 90 | — |
| 21 | 1.17 | 0.79 @ 565 | 42 | 92 | — |
| 22 | 1.24 | 0.79 @ 565 | 42 | 92 | — |

The results in Table 12 show that the Fischer microhardness values of the coatings prepared using Examples 1 through 22 of the present invention ranged from 10 to 147 (N/mm$^2$).

In Table 13, the results of Examples 1 through 22 showed that the photochromic performance values of the coatings could be made to vary widely.

The present invention has been described with reference to specific details of particular embodiments thereof. It is not intended that such details be regarded as limitations upon the scope of the invention except insofar as to the extent that they are included in the accompanying claims.

The invention claimed is:

1. An aqueous composition comprising an effective amount of at least one photosensitive material and at least one polymerizable component comprising at least one substantially hydrophilic monomer and at least one substantially hydrophobic monomer, said hydrophilic monomer and said hydrophobic monomer being adapted to combine and to at least partially form microparticles of said polymerizable component with which the photosensitive material is associated wherein the photosensitive material comprises at least one functional group capable of reacting with said polymerizable component and is substantially non-extractable from the microparticles.

2. An aqueous composition comprising an effective amount of at least one photosensitive material and at least one polymerizable component comprising at least one hydrophilic functional group and at least one hydrophobic functional group, said at least one photosensitive material and at least one polymerizable component being adapted to form at least partially crosslinked photosensitive polymeric microparticles wherein the photosensitive material comprises at least one functional group capable of reacting with said polymerizable component and is substantially non-extractable from the microparticles.

3. The aqueous composition of claim 2 wherein the photosensitive material is chosen from fluorescent materials, phosphorescent materials, nonlinear optical materials, photochromic materials or mixtures thereof.

4. The aqueous composition of claim 2 wherein the hydrophilic functional group is provided by at least one substantially hydrophilic monomer and the hydrophobic functional group is provided by at least one substantially hydrophobic monomer.

5. The aqueous composition of claim 4 wherein the polymerizable component further comprises at least one copolymerizable material that is different from the substantially hydrophilic monomer and the substantially hydrophobic monomer.

6. The aqueous composition of claim 4 wherein upon polymerization the substantially hydrophobic monomer forms a polymer having a glass transition temperature greater than or equal to the glass transition temperature of the polymer formed upon polymerization of the substantially hydrophilic monomer.

7. The aqueous composition of claim 4 wherein upon polymerization the substantially hydrophobic monomer forms a polymer having a glass transition temperature less than the glass transition temperature of the polymer formed upon polymerization of the substantially hydrophilic monomer.

8. The aqueous composition of claim 2 wherein the polymerizable component further comprises functionality that is reactive with crosslinking materials.

9. At least partially crosslinked photosensitive polymeric microparticles comprising an at least partially polymerized component comprising integral surface and interior domains wherein said surface domain comprises at least one substantially hydrophilic region, said interior domain comprises at least one substantially hydrophobic region, and at least one of said surface and/or interior domains has photosensitive material associated with said domain and wherein the photosensitive material comprises at least one functional group capable of reacting with said polymerizable component and is substantially non-extractable from the microparticles.

10. The at least partially crosslinked photosensitive polymeric microparticles of claim 9 wherein the surface and/or interior domain that is photosensitive comprises an effective amount of at least one photosensitive material chosen from fluorescent materials, phosphorescent materials, nonlinear optical materials, photochromic materials or mixtures thereof.

11. The at least partially crosslinked photosensitive polymeric microparticles of claim 9 wherein said photosensitive polymeric microparticles are adapted to form microparticles that are reactive with crosslinking material, magnetic, magnetically responsive, electrically conductive, dichroic, chromatic or combinations thereof.

12. The at least partially crosslinked photosensitive polymeric microparticles of claim 9 wherein the average particle size of said photosensitive polymeric microparticles is within the range of from 10 to 10,000 nanometers.

13. An aqueous dispersion of the at least partially crosslinked photosensitive polymeric microparticles of claim 9.

14. A photosensitive polymeric article comprising at least partially crosslinked photosensitive polymeric microparticles comprising an at least partially polymerized component comprising integral surface and interior domains wherein said surface domain comprises at least one substantially hydrophilic region, said interior domain comprises at least one substantially hydrophobic region, and at least one of said surface and/or interior domains has photosensitive material associated with said domain and wherein the photosensitive material comprises at least one functional group capable of reacting with said polymerizable component and is substantially non-extractable from the microparticles.

15. The photosensitive polymeric article of claim 14 wherein said article is an optical element.

16. The photosensitive polymeric article of claim 15 wherein said optical element is chosen from optical memory elements, display elements, ophthalmic elements, window elements or mirror elements.

17. The photosensitive polymeric article of claim 16 wherein the ophthalmic element is chosen from corrective lenses, non-corrective lenses, contact lenses, intra-ocular lenses, magnifying lenses, protective lenses or visors.

18. A photosensitive article comprising:
   a) a substrate; and
   b) an at least partially cured coating composition connected to at least a portion of at least one surface of the substrate, said coating composition comprising an effective amount of at least partially crosslinked photosensitive polymeric microparticles comprising an at least partially polymerized component comprising integral surface and interior domains wherein said surface domain comprises at least one substantially hydrophilic region, said interior domain comprises at least one substantially hydrophobic region, and at least one of said surface and/or interior domains has photosensitive material associated with said domain and wherein the photosensitive material comprises at least one functional group capable of reacting with said polymerizable component and is substantially non-extractable from the microparticles.

19. The photosensitive article of claim 18 wherein the substrate is a material chosen from glass, masonry, textile, ceramic, metal, wood, paper or polymeric organic material.

20. The photosensitive article of claim 18 wherein the substrate material is glass, ceramic or a polymeric organic material.

21. The photosensitive article of claim 20 wherein the substrate is chosen from un-tinted substrates, tinted substrates, photochromic substrates, tinted-photochromic substrates, linearly polarizing substrates, circularly polarizing substrates, elliptically polarizing substrates or reflective substrates.

22. The photosensitive article of claim 18 wherein the at least partially cured coating composition is an adhesive, a paint or an ink.

23. The photosensitive article of claim 22 wherein the coating composition is an adhesive.

24. The photosensitive article of claim 23 wherein said photosensitive article further comprises a first at least partially cured polymeric sheet connected to at least a portion of at least one surface of the coating composition.

25. The photosensitive article of claim 24 wherein said photosensitive article further comprises a second at least partially cured polymeric sheet said second polymeric sheet being adjacent to the substrate and connected to the first polymeric sheet by the coating composition.

26. The photosensitive article of claim 25 wherein at least one of the first and second polymeric sheets is photosensitive.

27. The photosensitive article of claim 18 wherein the coating composition comprises an at least partially ordered anisotropic material and wherein the crosslinked photosensitive polymeric microparticles are at least partially aligned with said anisotropic material.

28. The photosensitive article of claim 19 wherein said photosensitive article is an optical element chosen from optical memory elements, ophthalmic elements, display elements, window elements or mirror elements.

29. The photosensitive article of claim 28 wherein the ophthalmic element is chosen from corrective lenses, non-corrective lenses, contact lenses, intra-ocular lenses, magnifying lenses, protective lenses or visors.

30. The photosensitive article of claim 28 wherein the optical element is a display element chosen from screens, monitors, or security elements.

31. The photosensitive article of claim 30 wherein the security element comprises access cards and passes; negotiable instruments and non-negotiable instruments; government documents; consumer goods; credit cards; or merchandise tags, labels and packaging.

32. An optical element comprising:
   a) a first substrate having a first surface;
   b) a second substrate having a second surface, wherein the second surface of the second substrate is opposite the first surface of the first substrate; and
   c) a material positioned between said first surface and said second surface, said material comprising an effective amount of at least partially crosslinked photosensitive polymeric microparticles comprising an at least partially polymerized component comprising integral surface and interior domains wherein said surface domain comprises at least one substantially hydrophilic region, said interior domain comprises at least one substantially hydrophobic region and at least one of said surface and/or interior domains has photosensitive material associated with said domain and wherein the photosensitive material comprises at least one functional group capable of reacting with said polymerizable component and is substantially non-extractable from the microparticles.

33. The optical element of claim 32 wherein said optical element is chosen from optical memory elements, display elements, ophthalmic elements, window elements or mirror elements.

34. The optical element of claim 33 wherein the display element is chosen from screens, monitors, liquid crystal cells, organic light emitting devices or security elements.

35. The optical element of claim 32 wherein said optical element is an organic light emitting device wherein the first surface is an anode, the second surface is a cathode and the material positioned there between is an emissive material, said emissive material being in electrical contact with said anode and said cathode.

36. An aqueous composition comprising an effective amount of at least one photochromic material and at least one polymerizable component comprising at least one substantially hydrophilic monomer and at least one substantially hydrophobic monomer, said at least one photochromic material and at least one polymerizable component being adapted to form at least partially crosslinked photochromic polymeric microparticles wherein the photochromic material comprises at least one functional group reactive with the surface and/or interior domains of said microparticles to provide that said photochromic material is substantially non-extractable from the microparticles.

37. The aqueous composition of claim 36 further comprising at least one copolymerizable material that is different from the substantially hydrophilic monomer or the substantially hydrophobic monomer.

38. The aqueous composition of claim 36 wherein the photochromic material comprises organic photochromic materials.

39. The aqueous composition of claim 38 wherein the photochromic material is an organic photochromic material chosen from pyrans, oxazines, fulgides, fulgimides, diarylethenes or mixtures thereof.

40. The aqueous composition of claim 36 wherein upon polymerization the substantially hydrophobic monomer forms a polymer having a glass transition temperature less than the glass transition temperature of the polymer formed upon polymerization of the substantially hydrophilic monomer.

41. The aqueous composition of claim 36 wherein the substantially hydrophilic monomer comprises a urethane material that is adapted to form a rigid-segment and the substantially hydrophobic monomer comprises a urethane material that is adapted to form a flexible-segment.

42. The aqueous composition of claim 37 wherein the copolymerizable material is chosen from isocyanate-containing materials; epoxy-group containing materials; carboxy-group containing materials; carbonate group-containing materials; ethylenically unsaturated group containing materials; silyl-group containing materials or mixtures thereof.

43. At least partially crosslinked photochromic polymeric microparticles, said microparticles comprising at least one polymerized component comprising integral surface and interior domains wherein said surface domain comprises at least one substantially hydrophilic region, said interior domain comprises at least one substantially hydrophobic region and at least one of said interior and/or surface domains comprises at least one photochromic material wherein the photochromic material comprises at least one functional group reactive with the surface and/or interior domains of said microparticles to provide that said photochromic material is substantially non-extractable from the microparticles.

44. The at least partially crosslinked photochromic polymeric microparticles of claim 43 wherein the photochromic material comprises organic photochromic materials.

45. The at least partially crosslinked photochromic polymeric microparticles of claim 43 wherein the average particle size of said photochromic polymeric microparticles is within the range of from 40 to 1,000 nanometers.

46. The at least partially crosslinked photochromic polymeric microparticles of claim 43 wherein said photochromic polymeric microparticles are adapted to form microparticles that are reactive with crosslinking materials, magnetic, magnetically responsive, electrically conductive, dichroic, chromatic or combinations thereof.

47. A photochromic article comprising an at least partially cured polymeric organic material and an effective amount of at least partially crosslinked photochromic polymeric microparticles, said microparticles being the polymerized product of at least one polymerizable component comprising integral surface and interior domains wherein said surface domain comprises at least one substantially hydrophilic region, said interior domain comprises at least one substantially hydrophobic region and at least one of said interior and/or surface domains is photochromic wherein the photochromic material comprises at least one functional group reactive with the surface and/or interior domains of said microparticles to provide that said photochromic material is substantially non-extractable from the microparticles.

48. The photochromic article of claim 47 wherein the polymeric organic material is chosen from a thermosetting polymeric organic material, thermoplastic polymeric organic material or a mixture thereof.

49. The photochromic article of claim 47 wherein the polymeric organic material is chosen from poly($C_1$-$C_{12}$ alkyl methacrylates), poly(oxyalkylene dimethacrylates), poly (alkoxylated phenol methacrylates), cellulose acetate, cellulose triacetate, cellulose acetate propionate, cellulose acetate butyrate, poly(vinyl acetate), poly(vinyl alcohol), poly(vinyl chloride), poly(vinylidene chloride), thermoplastic polycarbonates, polyesters, polyurethanes, polythiourethanes, polysulfithiourethanes, poly(urea-urethane), poly(ethylene terephthalate), polystyrene, poly(alpha methylstyrene), copoly(styrene-methylmethacrylate), copoly(styrene-acrylonitrile), polyvinylbutyral or polymers prepared from bis (allyl carbonate) monomers, polyfunctional acrylate monomers, polyfunctional methacrylate monomers, diethylene glycol dimethacrylate monomers, diisopropenyl benzene monomers, ethoxylated bisphenol A dimethacrylate monomers, ethylene glycol bismethacrylate monomers, poly(ethylene glycol) bismethacrylate monomers, ethoxylated phenol bis methacrylate monomers, alkoxylated polyhydric alcohol polyacrylate monomers, styrene monomers, urethane acrylate monomers, glycidyl acrylate monomers, glycidyl methacrylate monomers, diallylidene pentaerythritol monomers or mixtures of such monomers.

50. The photochromic article of claim 47 wherein said article is an optical element.

51. The photochromic article of claim 50 wherein the optical element is an ophthalmic element chosen from corrective lenses, non-corrective lenses, contact lenses, intra-ocular lenses, magnifying lenses, protective lenses or visors.

52. A photochromic coated article comprising:
a) a substrate; and
b) an at least partially cured photochromic coating connected to at least a portion of at least one surface of said substrate, said photochromic coating comprising a film-forming polymer and an effective amount of at least partially crosslinked photochromic polymeric microparticles, said microparticles comprising integral surface and interior domains wherein said surface domain comprises at least one substantially hydrophilic region, said interior domain comprises at least one substantially hydrophobic region and at least one of said interior and/or surface domains comprises a photochromic material wherein the photochromic material comprises at least one functional group reactive with the surface and/or interior domains of said microparticles to provide that said photochromic material is substantially non-extractable from the microparticles.

53. The photochromic coated article of claim 52 wherein the film-forming polymer is chosen from thermosetting polymeric materials, thermoplastic polymeric materials or a mixture of such polymeric materials.

54. The photochromic coated article of claim 53 wherein the film-forming polymer is a thermosetting polymeric material that is chosen from polyurethanes, poly(urea-urethanes), aminoplast resins, polysiloxanes, polyanhydrides, polyacrylamides, epoxy resins or poly(meth)acrylates.

55. The photochromic coated article of claim 52 further comprising a primer coating connected to at least a portion of at least one surface of the substrate.

56. The photochromic coated article of claim 52 further comprising an at least partially abrasion resistant coating connected to at least a portion of at least one surface of the substrate.

57. The photochromic coated article of claim 56 further comprising a transitional coating interposed between the photochromic coating and the abrasion resistant coating.

58. The photochromic coated article of claim 52 further comprising an at least partially anti-reflective coating connected to at least a portion of at least one surface of the substrate.

59. The photochromic coated article of claim 52 further comprising a polarizing polymeric coating or sheet connected to at least a portion of at least one surface of the substrate.

60. The photochromic coated article of claim 52 wherein the substrate is chosen from paper, glass, ceramic, wood, masonry, textile, metal, or polymeric organic material.

61. The photochromic coated article of claim 60 wherein the substrate is polymeric organic material and said polymeric organic material is chosen from poly($C_1$-$C_{12}$ alkyl methacrylates), poly(oxyalkylene dimethacrylates), poly (alkoxylated phenol methacrylates), cellulose acetate, cellulose triacetate, cellulose acetate propionate, cellulose acetate butyrate, poly(vinyl acetate), poly(vinyl alcohol), poly(vinyl chloride), poly(vinylidene chloride), thermoplastic polycarbonates, polyesters, polyurethanes, polythiourethanes, polysulfithiourethanes, poly(urea-urethane), poly(ethylene terephthalate), polystyrene, poly(alpha methylstyrene), copoly(styrene-methylmethacrylate), copoly(styrene-acrylonitrile), polyvinylbutyral or polymers prepared from bis (allyl carbonate) monomers, polyfunctional acrylate monomers, polyfunctional methacrylate monomers, diethylene glycol dimethacrylate monomers, diisopropenyl benzene monomers, ethoxylated bisphenol A dimethacrylate monomers, ethylene glycol bismethacrylate monomers, poly(ethylene glycol) bismethacrylate monomers, ethoxylated phenol bis methacrylate monomers, alkoxylated polyhydric alcohol polyacrylate monomers, styrene monomers, urethane acrylate monomers, glycidyl acrylate monomers, glycidyl methacrylate monomers, diallylidene pentaerythritol monomers or mixtures thereof.

62. The photochromic coated article of claim 61 wherein the substrate is an optical element.

63. The photochromic coated article of claim 62 wherein the optical element is an ophthalmic element chosen from corrective lenses, non-corrective lenses, contact lenses, intra-ocular lenses, magnifying lenses, protective lenses or visors.

64. A photochromic composite article comprising:
 a) a substrate; and
 b) an at least partially cured photochromic polymeric sheet connected to at least a portion of at least one surface of said substrate, said photochromic polymeric sheet comprising an effective amount of at least partially crosslinked photochromic polymeric microparticles, said microparticles comprising integral surface and interior domains wherein said surface domain comprises at least one substantially hydrophilic region, said interior domain comprises at least one substantially hydrophobic region and at least one of said interior and/or surface domains comprises at least one photochromic material wherein the photochromic material comprises at least one functional group reactive with the surface and/or interior domains of said microparticles to provide that said photochromic material is substantially non-extractable from the microparticles.

65. The photochromic composite article of claim 64 wherein the photochromic polymeric sheet comprises thermosetting polymeric materials, thermoplastic polymeric materials or mixtures thereof.

66. The photochromic composite article of claim 65 wherein the photochromic polymeric sheet comprises a thermoplastic polyurethane.

67. The photochromic composite article of claim 64 further comprising an at least partially abrasion resistant protective polymeric sheet connected to the surface of said photochromic polymeric sheet.

68. The photochromic composite article of claim 67 wherein the protective polymeric sheet comprises thermosetting polymeric materials, thermoplastic polymeric materials or mixtures thereof.

69. The photochromic composite article of claim 68 wherein the protective polymeric sheet comprises a thermoplastic polycarbonate.

70. The photochromic composite article of claim 64 wherein said photochromic composite article is an optical element.

71. The photochromic composite article of claim 70 wherein the optical element is an ophthalmic element chosen from corrective lenses, non-corrective lenses, contact lenses, intra-ocular lenses, magnifying lenses, protective lenses or visors.

72. A photochromic composite article comprising:
 a) a substrate;
 b) an at least partially cured coating of a photochromic adhesive connected to at least a portion of at least one surface of said substrate, said photochromic adhesive comprising an adhesive material and an effective amount of at least partially crosslinked photochromic polymeric microparticles, said microparticles comprising integral surface and interior domains wherein said surface domain comprises at least one substantially hydrophilic region, said interior domain comprises at least one substantially hydrophobic region and at least one of said interior and/or surface domains comprises at least one photochromic material wherein the photochromic material comprises at least one functional group reactive with the surface and/or interior domains of said microparticles to provide that said photochromic material is substantially non-extractable from the microparticles; and
 c) a first at least partially cured polymeric sheet connected to said photochromic adhesive coating.

73. The photochromic composite article of claim 72 wherein said photochromic article further comprises a second at least partially cured polymeric sheet, said second polymeric sheet being adjacent to the substrate and connected to the first polymeric sheet by the photochromic adhesive coating.

74. The photochromic composite article of claim 73 wherein at least one of the first and second polymeric sheets is photochromic.

75. The photochromic composite article of claim 72 wherein said article is an optical element.

76. The photochromic composite article of claim 73 wherein said article is an ophthalmic element.

77. The photochromic composite article of claim 74 wherein said article is a security element.

78. The photochromic composite article of claim 76 wherein the ophthalmic element is chosen from corrective lenses, non-corrective lenses, contact lenses, intra-ocular lenses, magnifying lenses, protective lenses or visors.

* * * * *